(12) United States Patent
Hiramatsu et al.

(10) Patent No.: US 6,888,236 B2
(45) Date of Patent: May 3, 2005

(54) CERAMIC SUBSTRATE FOR MANUFACTURE/INSPECTION OF SEMICONDUCTOR

(75) Inventors: Yasuji Hiramatsu, Gifu (JP); Yasutaka Ito, Gifu (JP); Atsushi Ozaki, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/926,464

(22) PCT Filed: Mar. 7, 2001

(86) PCT No.: PCT/JP01/01787

§ 371 (c)(1),
(2), (4) Date: Jan. 10, 2002

(87) PCT Pub. No.: WO01/66488

PCT Pub. Date: Sep. 13, 2001

(65) Prior Publication Data

US 2003/0089975 A1 May 15, 2003

(30) Foreign Application Priority Data

Mar. 7, 2000 (JP) .............................. 2000-061901

(51) Int. Cl.⁷ .................. H01L 23/053; H01L 29/40; C22C 29/02; H01B 3/12; C04B 35/581
(52) U.S. Cl. ................... 257/703; 257/700; 257/701; 257/758; 257/705; 257/620; 501/98.4; 501/152; 279/128; 361/234; 428/689; 428/698
(58) Field of Search ............... 257/703, 620, 257/700, 701, 758, 705, 707; 501/98.4, 152; 279/128; 361/234; 428/689, 698

(56) References Cited

U.S. PATENT DOCUMENTS 4,283,753 A * 8/1981 Burn ................ 361/321.4

4,613,455 A   9/1986 Suzuki et al.
5,317,132 A * 5/1994 Clough et al. ............ 219/543

(Continued)

FOREIGN PATENT DOCUMENTS

| JP | 59-151344 | * 8/1984 |
| JP | 63-11575 | 1/1988 |
| JP | 4-317402 | 11/1992 |
| JP | 5-97523 | 4/1993 |
| JP | 5-117039 | 5/1993 |
| JP | 5-147910 | 6/1993 |
| JP | 6-191955 | 7/1994 |
| JP | 9-30866 | 2/1997 |
| JP | 9-124383 | 5/1997 |
| JP | 10-80168 | 3/1998 |
| JP | 11-228234 | 8/1999 |
| JP | 11-236270 | 8/1999 |

OTHER PUBLICATIONS

U.S. Appl. No. 09/926,464, filed Jan. 10, 2002, Hiramatsu et al.
U.S. Appl. No. 10/732,296, filed Dec. 11, 2003, Ito et al.
U.S. Appl. No. 10/746,081, filed Dec. 29, 2003, Hiramatsu et al.

(Continued)

Primary Examiner—Alexander Oscar Williams
(74) Attorney, Agent, or Firm—Oblon, Spivak, McClelland, Maier & Neustadt, P.C.

(57) ABSTRACT

A ceramic substrate for a semiconductor producing/examining device which has high fracture toughness value, excellent thermal shock resistivity, high thermal conductivity and an excellent temperature rising and falling properties, can be used as a hot plate, an electrostatic chuck, a wafer prober and the like. A ceramic substrate, for a semiconductor producing/examining device, having a conductor formed inside or on the surface thereof has been sintered such that a fractured section thereof exhibits intergranular fracture.

26 Claims, 12 Drawing Sheets

U.S. PATENT DOCUMENTS

| | | | |
|---|---|---|---|
| 5,350,720 | A | 9/1994 | Kawada et al. |
| 5,460,640 | A * | 10/1995 | Buljan .................... 75/233 |
| 5,949,135 | A * | 9/1999 | Washida et al. ............ 257/685 |
| 5,973,388 | A * | 10/1999 | Chew et al. ................ 257/676 |
| 6,001,760 | A * | 12/1999 | Katsuda et al. ............ 501/98.4 |
| 6,043,176 | A * | 3/2000 | Brandt ..................... 82/1.11 |
| 6,110,582 | A * | 8/2000 | Wu et al. .................... 428/332 |
| 6,362,120 | B1 * | 3/2002 | Fukushima ................. 501/127 |
| 6,436,317 | B1 * | 8/2002 | Malozemoff et al. .... 252/519.1 |
| 6,458,444 | B1 * | 10/2002 | Natsuhara et al. .......... 428/141 |
| 6,465,763 | B1 | 10/2002 | Ito et al. |
| 6,475,606 | B2 | 11/2002 | Niwa |
| 6,500,567 | B1 * | 12/2002 | Bertero et al. .............. 428/667 |
| 6,507,006 | B1 | 1/2003 | Hiramatsu et al. |
| 6,677,557 | B2 | 1/2004 | Ito et al. |
| 6,710,307 | B2 | 3/2004 | Ito et al. |
| 6,717,116 | B1 | 4/2004 | Ito et al. |
| 2004/0033883 | A1 * | 2/2004 | Yeckley ..................... 501/98.2 |

OTHER PUBLICATIONS

U.S. Appl. No. 10/755,308, filed Jan. 13, 2004, Hiramatsu et al.
U.S. Appl. No. 10/766,027, filed Jan. 29, 2004, Ito et al.
U.S. Appl. No. 09/673,953, filed Dec. 21, 2000, Ito et al.
U.S. Appl. No. 10/346,095, filed Jan. 17, 2003, Ito et al.
U.S. Appl. No. 10/663,681, filed Sep. 17, 2003, Ito et al.
U.S. Appl. No. 10/048,490, filed Apr. 30, 2002, Ito et al.
U.S. Appl. No. 09/524,010, filed Mar. 13, 2000, Niwa.
U.S. Appl. No. 09/946,463, filed Sep. 6, 2001, Niwa.
U.S. Appl. No. 10/244,008, filed Sep. 16, 2002, Niwa.
U.S. Appl. No. 10/670,354, filed Sep. 26, 2003, Niwa.
U.S. Appl. No. 10/168,527, filed Oct. 18, 2002, Hiramatsu et al.
U.S. Appl. No. 09/926,465, filed Feb. 12, 2002, Furukawa et al.
U.S. Appl. No. 09/831,887, filed May 23, 2001, Ito et al.
U.S. Appl. No. 10/387,452, filed Mar. 14, 2003, Ito et al.
U.S. Appl. No. 10/069,943, filed Jul. 10, 2002, Ito et al.
U.S. Appl. No. 10/732,296, filed Dec. 11, 2003, Ito et al.
U.S. Appl. No. 10/277,818, filed Oct. 23, 2002, Hiramatsu et al.
U.S. Appl. No. 10/755,308, filed Jan. 13, 2004, Hiramatsu et al.
U.S. Appl. No. 09/807,960, filed May 18, 2001, Hiramatsu et al.
U.S. Appl. No. 10/229,177, filed Aug. 28, 2002, Hiramatsu et al.
U.S. Appl. No. 10/049,293, filed Apr. 30, 2002, Ito et al.
U.S. Appl. No. 10/226,160, filed Aug. 23, 2002, Ito et al.
U.S. Appl. No. 10/658,454, filed Sep. 10, 2003, Ito et al.
U.S. Appl. No. 09/806,478, filed Jul. 26, 2001, Ito et al.
U.S. Appl. No. 09/926,092, filed Dec. 27, 2001, Ito et al.
U.S. Appl. No. 10/618,651, filed Jul. 15, 2003, Ito et al.
U.S. Appl. No. 10/618,623, filed Jul. 15, 2003, Ito et al.
U.S. Appl. No. 10/618,655, filed Jul. 15, 2003, Ito et al.
U.S. Appl. No. 10/618,665, filed Jul. 15, 2003, Ito et al.
U.S. Appl. No. 09/869,321, filed Oct. 18, 2001, Zhou.
U.S. Appl. No. 09/926,012, filed Oct. 24, 2001, Hiramatsu et al.
U.S. Appl. No. 10/352,138, filed Jan. 28, 2003, Hiramatsu et al.
U.S. Appl. No. 10/260,360, filed Oct. 1, 2002, Niwa.
U.S. Appl. No. 09/926,297, filed Dec. 26, 2001, Hiramatsu et al.
U.S. Appl. No. 10/746,081, filed Dec. 29, 2003, Hiramatsu et al.
U.S. Appl. No. 09/926,296, filed Dec. 27, 2001, Ito et al.
U.S. Appl. No. 09/926,362, filed Jan. 16, 2002, Hiramatsu et al.
U.S. Appl. No. 10/442,967, filed May 22, 2003, Hiramatsu et al.
U.S. Appl. No. 09/926,464, filed Jan. 10, 2002, Hiramatsu et al.
U.S. Appl. No. 10/759,083, filed Jan. 20, 2004, Hiramatsu et al.
U.S. Appl. No. 09/926,499, filed Mar. 22, 2002, Hiramatsu et al.
U.S. Appl. No. 10/386,615, filed Mar. 13, 2003, Hiramatasu et al.
U.S. Appl. No. 10/088,100, filed Jun. 26, 2002, Ido.
U.S. Appl. No. 09/926,714, filed Mar. 5, 2002, Ito et al.
U.S. Appl. No. 10/009,174, filed Apr. 21, 2003, Hiramatsu et al.
U.S. Appl. No. 09/926,713, filed Mar. 5, 2002, Hiramatsu et al.
U.S. Appl. No. 10/619,567, filed Jul. 16, 2003, Hiramatsu et al.
U.S. Appl. No. 09/926,800, filed Mar. 19, 2002, Hiramatsu et al.
U.S. Appl. No. 10/615,950, filed Jul. 10, 2003, Hiramatsu et al.
U.S. Appl. No. 10/311,368, filed May 9, 2003, Ito et al.
U.S. Appl. No. 10/416,497, filed Dec. 11, 2003, Hiramatsu et al.
U.S. Appl. No. 10/697,287, filed Oct. 31, 2003, Ito et al.
U.S. Appl. No. 10/019,448, filed Apr. 8, 2002, Ito et al.
U.S. Appl. No. 10/019,444, filed Apr. 23, 2002, Hiramatsu et al.
U.S. Appl. No. 10/019,311, filed Apr. 9, 2002, Hiramatsu et al.
U.S. Appl. No. 10/397,321, filed Mar. 27, 2003, Hiramatsu et al.
U.S. Appl. No. 10/030,123, filed May 16, 2002, Hiramatsu et al.
U.S. Appl. No. 10/718,535, filed Nov. 24, 2003, Hiramatsu et al.
U.S. Appl. No. 10/343,747, filed Aug. 27, 2003, Ito et al.
U.S. Appl. No. 10/048,979, filed Apr. 26, 2002, Hiramatsu et al.
U.S. Appl. No. 10/048,989, filed May 29, 2002, Hiramatsu et al.
U.S. Appl. No. 10/069,511, filed Jun. 24, 2002, Ito et al.
U.S. Appl. No. 10/069,510, filed Jun. 20, 2002, Hiramatsu et al.
U.S. Appl. No. 10/070,443, filed Jun. 24, 2002, Hiramatsu et al.
U.S. Appl. No. 10/070,441, filed Jun. 26, 2002, Ito et al.
U.S. Appl. No. 10/088,098, filed May 30, 2002, Ito et al.
U.S. Appl. No. 10/362,941, filed Apr. 28, 2003, Ito.
U.S. Appl. No. 10/111,980, filed Jun. 27, 2002, Ito et al.
U.S. Appl. No. 10/343,833, filed Sep. 22, 2003, Zhou et al.
U.S. Appl. No. 10/344,148, filed Jul. 29, 2003, Kariya et al.
U.S. Appl. No. 10/398,393, filed Jan. 21, 2004, Hiramatsu et al.
U.S. Appl. No. 10/473,585, filed Feb. 13, 2004, Ito.
U.S. Appl. No. 10/363,310, filed Mar. 3, 2003, Ito.
U.S. Appl. No. 10/432,639, filed Nov. 6, 2003, Ito et al.

U.S. Appl. No. 09/462,067, filed Jan. 5, 2001, Furukawa et al.
U.S. Appl. No. 09/471,759, filed Dec. 23, 1999, Saito et al.
U.S. Appl. No. 09/787,816, filed Mar. 23, 2001, Ito .
U.S. Appl. No. 09/917,749, filed Jul. 31, 2001, Ito.
U.S. Appl. No. 09/787,954, filed Mar. 23, 2001, Ito.
U.S. Appl. No. 10/345,356, filed Jan. 16, 2003, Ito.
U.S. Appl. No. 09/787,818, filed Mar. 23, 2001, Ito.
U.S. Appl. No. 09/915,418, filed Jul. 27, 2001, Ito.
U.S. Appl. No. 10/356,519, filed Feb. 3, 2003, Ito.
U.S. Appl. No. 10/217,029, filed Aug. 13, 2002, Ito.
U.S. Appl. No. 09/979,676, filed Nov. 5, 2001, Zhou.
U.S. Appl. No. 10/049,539, filed Nov. 7, 2001, Zhou.
U.S. Appl. No. 10/048,894, filed Feb. 1, 2002, Furukawa.
U.S. Appl. No. 09/806,957, filed Apr. 6, 2001, Ito et al.
U.S. Appl. No. 09/890,358, filed Jul. 30, 2001, Ito.
U.S. Appl. No. 09/916,682, filed Jul. 30, 2001, Ito.
U.S. Appl. No. 09/916,682, filed Jul. 30, 2001, Ito.
U.S. Appl. No. 10/222,928, filed Aug. 19, 2002, Ito.
U.S. Appl. No. 10/182,009, filed Jul. 24, 2002, Zhou.
U.S. Appl. No. 09/880,379, filed Jun. 13, 2001, Saito et al.

* cited by examiner

CERAMIC SUBSTRATE FOR MANUFACTURE/INSPECTION OF SEMICONDUCTOR

TECHNICAL FIELD

The present invention relates to a ceramic substrate for a semiconductor producing/examining device which is used mainly in semiconductor industries. Particularly, the invention relates to the ceramic substrate which has high fracture toughness value, and excellent adsorbing ability of a semiconductor wafer in case that the substrate is used for an electrostatic chuck, and has an excellent temperature rising and falling properties in case that the substrate is used as a hot plate (a heater).

BACKGROUND ART

A semiconductor is an extremely important product which is required in various industries, and after an a semiconductor chip is produced in such a manner that a silicon single crystal is sliced into a predetermined thickness and a silicon wafer is produced, a plurality of semiconductor circuits and the like are formed on the silicon wafer.

At the step of producing this semiconductor chip, the silicon wafer placed on an electrostatic chuck is subjected to various processes such as CVD so that semiconductor circuits, elements and the like are formed. At this time, since corrosive gas is used as deposition gas, etching gas and the like, it is necessary to protect an electrostatic electrode layer from corrosion due to the gas. Moreover, since it is necessary to cause an adsorbing power, the electrostatic electrode layer is normally covered with a ceramic dielectric film and the like.

As this ceramic dielectric film, a nitride ceramic has been conventionally used. For instance, JP Kokai Hei 5-8140 discloses an electrostatic chuck which uses nitride such as aluminum nitride and the like. Moreover, JP Kokai Hei 9-48668 discloses carbon-containing aluminum nitride having Al—O—N structure.

SUMMARY OF THE INVENTION

However, these electrostatic chucks using the ceramics have a problem that their fracture toughness value is low and they are easily cracked by thermal shock and the like.

Further, it is found that such a problem is seen not only in the electrostatic chucks but also in a ceramic substrate for a semiconductor producing/examining device which have a conductor formed on the surface thereof or inside thereof.

The inventors of the present invention earnestly studied means for solving the above problem, and found out that setting a firing condition, or processing a sintered body after a firing process such that intergranular fracture appears in a fractured section, works. More specifically, the inventors found out that: by adding a small amount of boron, sodium, calcium, silicon and the like to raw material powder and then fire the powder; or by annealing the sintered body, the sintered body, in which intergranular fracture (grain boundary fracture) appears in its fractured face, can be obtained. Thus, the inventors completed the present invention.

Namely, the present invention is a ceramic substrate, for a semiconductor producing/examining device, having a conductor inside thereof or on the surface thereof, wherein the ceramic substrate has been sintered such that a fractured section thereof exhibits intergranular fracture.

Further, in the ceramic substrate for a semiconductor producing/examining device of the present invention, it is desirable that an average diameter of ceramic grains of the fractured section is 0.5 to 10 μm.

Further, in the ceramic substrate for a semiconductor producing/examining device of the present invention, it is preferable that an impurity element is locally distributed in boundaries of ceramic grains of said fractured section.

In addition, it is preferable that thermal conductivity of said ceramic substrate is 100 W/m·K or more.

In addition, in the ceramic substrate for a semiconductor producing/examining device of the present invention, it is preferable that said ceramic substrate is constituted such that:

an impurity-existent area where an impurity element is locally distributed in triple points of crystal grains, and an impurity element-nonexistent area where an impurity is not locally distributed in the triple points of the crystal grains, coexist therein.

| Explanation of Symbols | |
| --- | --- |
| 1, 11, 63 | ceramic substrate |
| 2, 22, 32a, 32b | chuck positive electrostatic layer |
| 3, 23, 33a, 33b | chuck negative electrostatic layer |
| 2a, 3a | semicircular arc part |
| 2b, 3b | comb teeth-shaped part |
| 4 | ceramic dielectric film |
| 5, 12, 25, 61 | resistance heating element |
| 6, 13, 18 | external terminal |
| 7 | metal wire |
| 8 | Peltier device |
| 9 | silicon wafer |
| 10 | ceramic heater |
| 14 | bottomed hole |
| 15 | through hole |
| 16, 17, 19 | conductor filled through hole |
| 20, 30, 101, 201, 301, 401 | electrostatic chuck |
| 25a | metal covering layer |
| 35, 36 | blind hole |
| 41 | supporting case |
| 42 | coolant outlet |
| 43 | inhalation duct |
| 44 | coolant inlet |
| 45 | heat insulating material |
| 62 | chuck top conductor layer |
| 65 | guard electrode |
| 66 | ground electrode |
| 66a | electrode non-formed area |
| 67 | groove |
| 68 | air suction hole |
| 501 | wafer prober |

DETAILED DISCLOSURE OF THE INVENTION

The present invention is a ceramic substrate, for a semiconductor producing/examining device, having a conductor formed inside thereof or on the surface thereof, wherein said ceramic substrate has been sintered such that a fractured section thereof exhibits intergranular fracture.

Namely, the ceramic substrate for a semiconductor producing/examining device of the present invention has its feature in that an element (for example, boron, sodium, calcium, silicon and oxygen, or an impurity element such as rare earth elements for a sintering aid) other than elements which is constituting nitride ceramic, carbide ceramic and oxide ceramic is locally distributed in ceramic grain boundaries.

Here, the local distribution can be confirmed by checking a peak of fluorescent X ray or a mapping image (reference to FIG. 16), and intensity of the fluorescent X ray appears more strongly in the boundaries than inside of crystal.

Figure 16:
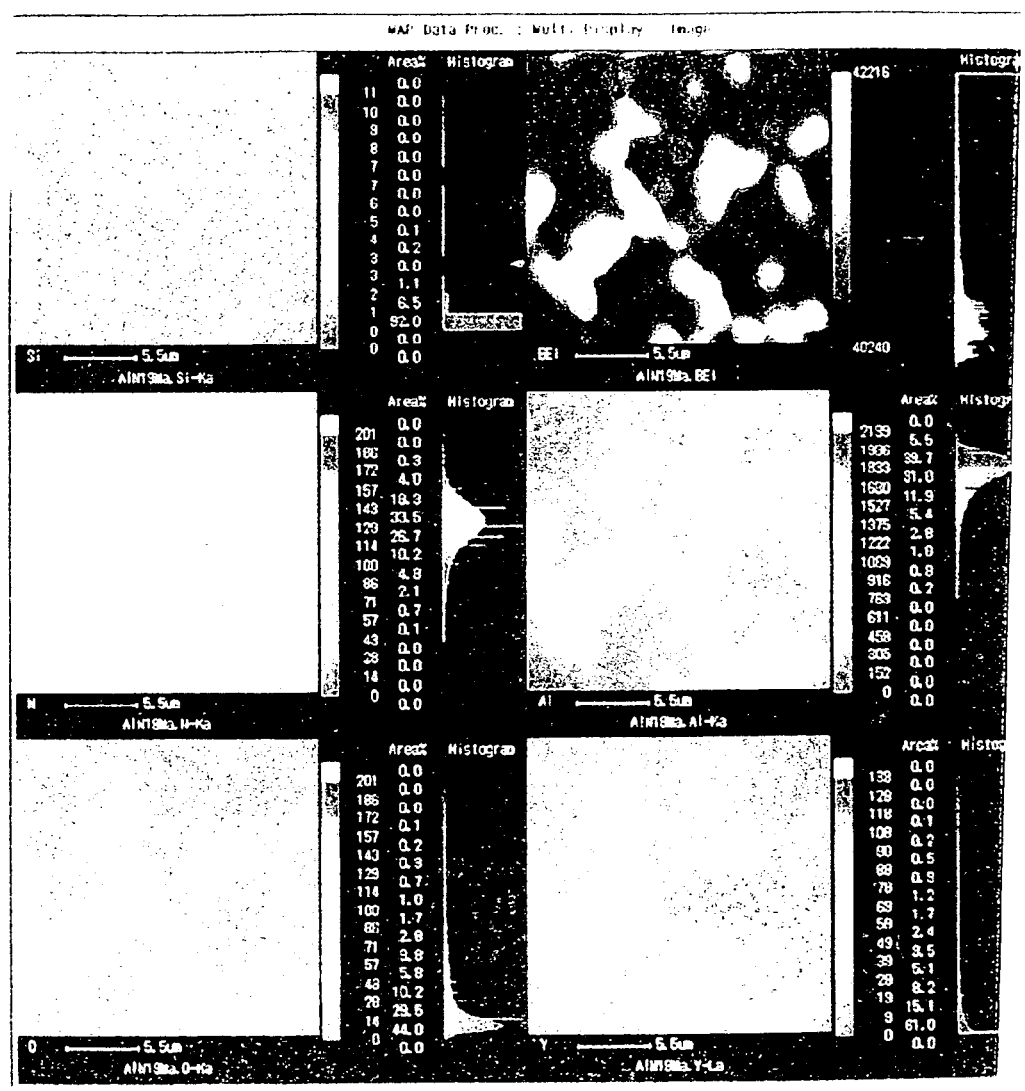
FIG. 16 is a mapping image of a part of the ceramic substrate of the present invention.

In FIG. 16, "BEI" is an electron microscope photograph, "Al" is an aluminum-existent area, "Y" is an yttrium-existent area, "Si" is a silicon-existent area, "N" is a nitrogen-existent area and "O" is an oxygen-existent area.

In this electron microscope photograph, grain boundary triple points are observed to shine in white, and it is understood that they are Y, O and Si, based on the mapping image of FIG. 16.

Figure 17:
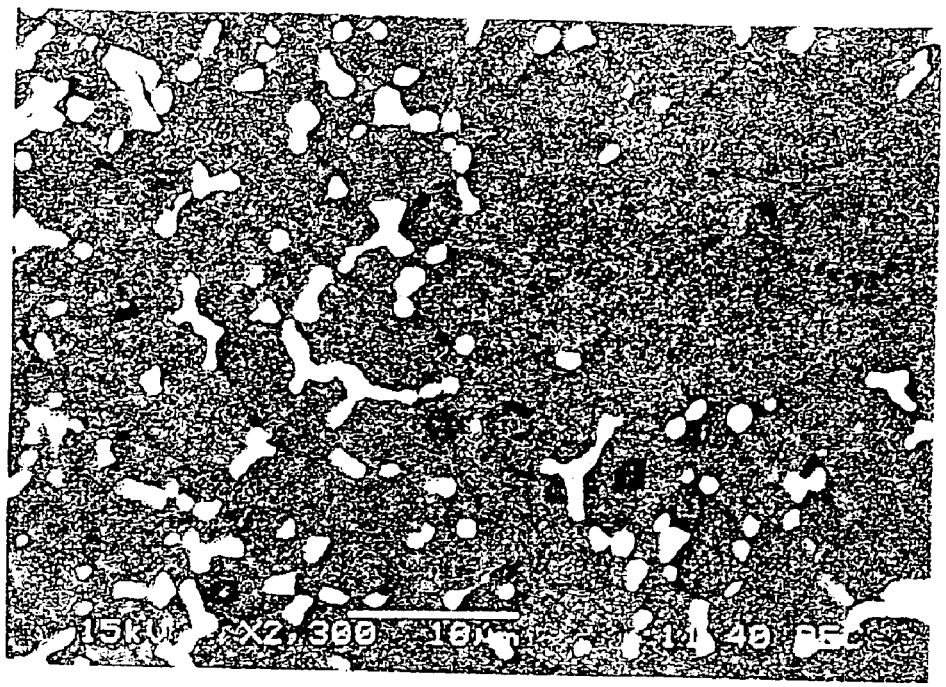
FIG. 17 is an electron microscope photograph of a part of the ceramic substrate of the present invention.
Figure 18:
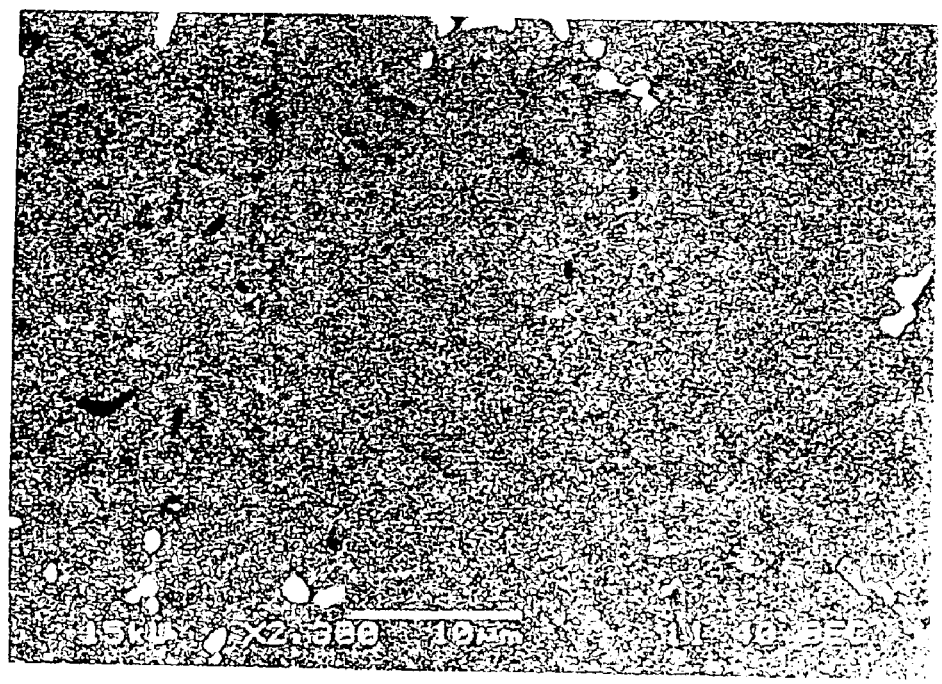
FIG. 18 is an electron microscope photograph of a part of the ceramic substrate of the present invention.

In addition, desirably, the ceramic substrate is constituted such that: an impurity-existent area (reference to FIG. 17) where an impurity element is locally distributed on the triple points of the crystal grain, and an impurity element-nonexistent area (reference to FIG. 18) where an impurity is not locally distributed on the triple points of the crystal grains, coexist therein. In FIG. 17, the triple points of the grain boundaries shine in white, and area shining in white is the impurity-existent area. Here, a portion which shines in white does not exist on an upper-right portion of FIG. 17, and this is the impurity element-nonexistent area.

It is desirable that a ratio of the impurity-existent area where the impurity element is locally distributed on the triple points of the crystal grains to the impurity element-nonexistent area where the impurity is not locally distributed on the triple points of the crystal grains is 10/90 to 90/10 in an area ratio of a section.

In such a morphology in which the impurity-existent area and the impurity element-nonexistent area coexist, a fracture toughness value becomes larger, and thermal conductivity is larger. This is because expansion of a crack is suppressed. This is also because ceramic grains come in contact with each other in grain boundaries other than the triple points, since impurities are locally distributed on the triple points, and thus making the thermal conductivity thereof high.

In addition, it is desirable that a percentage of the impurity-existent area becomes larger towards the center of the ceramic substrate. This is particularly because high thermal conductivity in a vicinity of the surface and electric insulating property in a direction of thickness of the ceramic substrate can be secured simultaneously.

The ceramic substrate having such a morphology can be produced by the following producing method.

Figure 19:
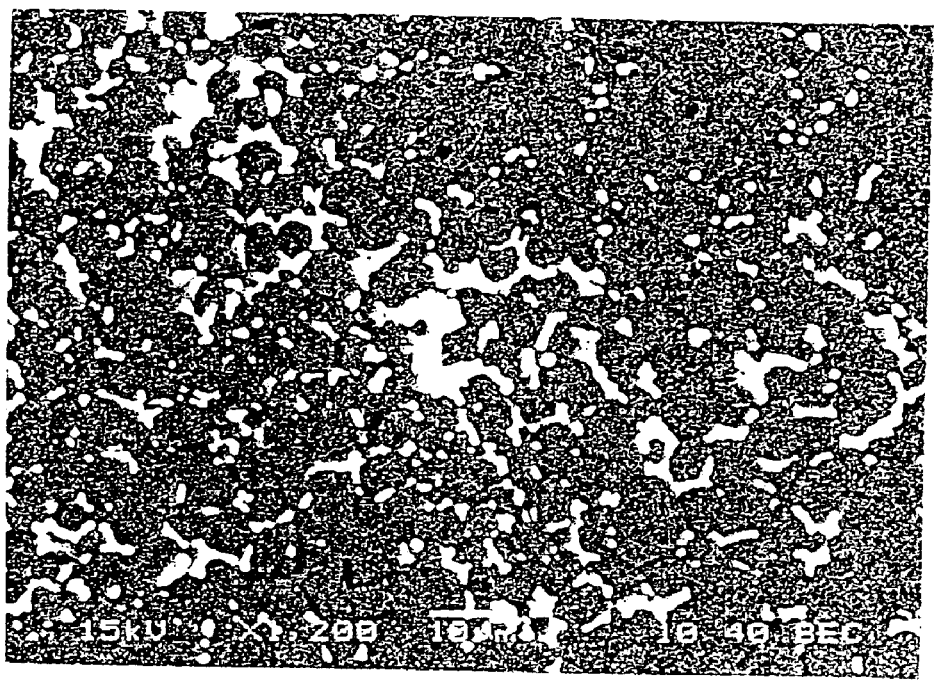
FIG. 19 is an electron microscope photograph of a part of the ceramic substrate of the present invention.

Namely, normally in the production of the ceramic substrate, hot press is carried out by using a carbon jig (reference to examples 1 to 13). In this case, the impurity-existent area exists uniformly on the whole substrate (reference to FIG. 19). On the contrary, when ceramic green sheets which do not include a sintering aid are laminated on both upper and lower sides of a formed body which is not yet sintered, the impurities are allowed to be absorbed by the ceramic green sheets at the time of sintering so that the sintered body, wherein the impurity-existent area where an impurity element is locally distributed on the triple points of the crystal grains and the impurity element-nonexistent area where the impurity is not locally distributed on the triple points of the crystal grains coexist, can be produced. Incidentally, in case that the ceramic substrate is produced by such a method, since a quantity of the impurities is small at a portion which comes in contact with the green sheets, a percentage of the impurity-existent area becomes relatively larger towards the center of the ceramic substrate.

In addition, in the ceramic substrate, it is fine if the intergranular fracture may appear in most portions of the fractured section, and it is not necessary that the intergranular fracture appears on the whole fractured section.

Since the above ceramic substrate is sintered so that the intergranular fracture appears in its fractured section, in case that fracture occurs, a generated crack is extended while winding along the boundaries of the grains. Therefore, the extension of a crack is suppressed, and the fracture toughness value is improved. As a result, the ceramic substrate has excellent thermal shock resistance. Moreover, in a ceramic substrate which has gone through the annealing treatment and the like, the impurities are removed from, the crystal grains and are segregated in the grain boundaries. Hence, a degree of purity rises, and the thermal conductivity of the whole ceramic substrate becomes excellent.

As mentioned above, in order to sinter the ceramic substrate such that the intergranular fracture appears in the fractured section, it is desirable that a slight quantity of an impurity element or their compound and the like is added to raw material powder, and this powder is used to form a formed body and carry out the firing.

In case that the impurity element or their compound (hereinafter, simply referred to as impurities) is added to the raw material powder, it is desirable that an addition amount of the impurities is adjusted to 0.05 to 500 ppm (in weight) Further, it is desirable that the produced ceramic substrate is subjected to the annealing treatment at 1400 to 2000° C.

When the impurities are added to the raw material powder; or the substrate undergoes the annealing treatment in such a manner, impurities such as boron (boron nitride), O, Na, Ca and Si are inclined to be segregated, and bonding of the grains becomes relatively weak.

In addition, as mentioned above, when the ceramic substrate is subjected to the annealing treatment and the like, the impurities are removed from the crystal grains and segregated to the grain boundaries so that the crystal grains do not include the impurities and has high crystallinity.

When a force is applied to the sintered body having such a structure, a crack is extended in the structure along the grain boundaries where the bonding force is weak, and the fracture toughness value becomes high. Moreover, in the ceramic substrate which was subjected to the annealing treatment and the like, the thermal conductivity becomes high due to the high crystallinity of the grains. However, when an addition amount of the impurities is increased, the sinter itself does not proceeds and a pore tends to remain so that mechanical characteristics and electrical characteristics are deteriorated, and this is not preferable.

As the impurities, for example, boron, sodium, calcium, silicon and oxygen are desirable. Particularly as boron compound, BN is used.

An average particle diameter of the ceramic raw material powder is preferably about 0.1 to 1 $\mu$m. This is because the powder is easily sintered. This is also because, when the average particle diameter exceeds 1 $\mu$m, an average diameter of the sintered ceramic grains easily exceeds 10 $\mu$m.

In addition, particularly in the present invention, it is desirable that the ceramic grains observed in the fractured section (the grains in the fractured section are secondary grains where the sinter proceeds, and their diameter is completely different from the diameter of the raw material particles) have an average diameter of 0.5 to 10 $\mu$m. The average diameter was measured in such a manner that: five samples are prepared, 10 portions in each sample are photographed by an electron microscope, the maximum diameter and the minimum diameter of each grain are averaged so as to obtain a grain diameter, and an average of the grain diameters in the image is calculated to obtain an average grain diameter of one image. Further, an average of the average grain diameters in the 50 images is obtained to have the average diameter. When the average diameter is large, the fracture toughness value and the bending strength become low, and when the average diameter is small, the thermal conductivity is lowered. It is presumed that the thermal conductivity drops because barriers of the grain boundaries become large. The range of the average diameter of 0.5 to 10 $\mu$m can satisfy both the mechanical strength such as the fracture toughness value and bending strength and the like, and the thermal conductivity. Further, the average diameter is optimally 1 to 5 $\mu$m.

In the present invention, whether the fractured section exhibits the intergranular fracture or not is determined on the basis of electron microscope photograghs taken at a magnification of 2000 to 5000 times. When fracture occurs at the grain boundaries, the fractured section looks complicated and the configuration of grains is observed on the surface, the fracture is regarded as the intergranular fracture. On the other hand, when fracture occurs inside grains and the fractured section is relatively flat, the fracture is regarded as the intragranular fracture.

It is desirable that the ceramic substrate for a semiconductor producing/examining device of the present invention is used at 150° C. or more, and most preferably is used at 200° C. or more.

In addition, in the ceramic substrate, it is desirable that a pore diameter of the maximum pore is 50 $\mu$m or less and the porosity is 5% or less. Moreover, in case that no pore exists or the pore exists in the ceramic substrate, it is desirable that the diameter of the maximum pore is 50 $\mu$m or less.

When no pore exists, a breakdown voltage becomes particularly high at high temperature, and on the contrary, when a certain number of pores exist, the fracture toughness value becomes higher. For this reason, as to which design is selected depends on required properties.

The reason for the fracture toughness value becoming higher due to the existence of pores is not clear, but it is presumed that the growth of a crack is stopped also by pores.

In the present invention, the diameter of the maximum pore is desirably 50 $\mu$m or less because when the pore diameter exceeds 50 $\mu$m, it is difficult to secure the high breakdown voltage properties at high temperature, particularly at 100° C. or more.

It is desirable that the diameter of the maximum pore is 10 $\mu$m or less. This is because a warp amount at 200° C. or more becomes small.

The porosity or the pore diameter of the maximum pore is adjusted by changing the pressurizing duration, the applied pressure, the temperature during the sintering process or an additive such as SiC, BN and the like. As mentioned above, SiC or BN serves to generate pores because these compounds inhibit sintering.

The measurement of the pore diameter of the maximum pore is performed by the steps of: preparing five samples and mirror-grinding the surface thereof; photographing the surface of each sample at ten sites by an electron microscope at the magnification rate of 2000 times to 5000 times; selecting the maximum pore diameter from each photograph; and regarding the average of the maximum pore diameter of the 50 shots as the pore diameter of the maximum pore.

The abovementioned porosity is preferably measured by the Archimedes' method. This method includes the steps of: pulverizing the sintered body to obtain the specific gravity thereof; and calculating the porosity from the obtained true specific gravity and the apparent specific gravity.

It is desirable that the diameter of the ceramic substrate is 200 mm or more. It is especially preferable that the diameter of the ceramic substrate is 12 inches (300 mm) or more because this larger size will be a main stream in the semiconductor wafer of the next generation.

It is desirable that a thickness of the ceramic substrate is 50 mm or less, and particularly 25 mm or less is desirable.

When the thickness of the ceramic substrate exceeds 25 mm, heat capacity of the ceramic substrate occasionally becomes so large that the temperature following property thereof deteriorates due to the large heat capacity, especially when the ceramic substrate is heated or cooled by a temperature controlling means.

It is optimal that the thickness of the ceramic substrate exceeds particularly 1.5 mm and is 5 mm or less.

The ceramic material constituting the ceramic substrate is not particularly limited, and for example, nitride ceramic, carbide ceramic, oxide ceramic and the like are used.

As the nitride ceramic, a metal nitride ceramic, such as aluminum nitride, silicon nitride or boron nitride and the like is used.

In addition, as the carbide ceramic, a metal carbide ceramic such as silicon carbide, zirconium carbide, tantalum carbide or tungsten carbide and the like is used.

As the oxide ceramic, a metal oxide ceramic such as alumina, zirconia, cordierite or mullite and the like is used.

These ceramics may be used individually, or as a combination of two or more kinds of them.

Among these ceramics, the nitride ceramic and the oxide ceramic are preferable.

Furthermore, in the nitride ceramic, the aluminum nitride is the most suitable. This is because the thermal conductivity is 180 W/m·K, namely, the highest.

It is desirable that the ceramic substrate includes 0.05 to 10 weight % of oxygen. By segregating oxygen in the grain boundaries, the fracture toughness value can be improved.

When the content of oxygen is less than 0.05 weight %, the sintering does not proceed and the porosity becomes high, and the thermal conductivity drops. To the contrary, when the content of oxygen exceeds 10 weight %, an amount of oxygen in the grain boundaries becomes too large, and thus the thermal conductivity drops and the temperature rising and falling property drops.

In order to incorporate oxygen into the ceramic substrate, a metal oxide is mixed in the raw material powder and then firing is carried out.

As the metal oxide, oxide of rare earth elements such as Y, La, Ce, Pr, Nd, Pm, Sm, Eu, Gd, Tb, Dy, Ho, Er, Tm, Yb and Lu can be used, among them $Y_2O_3$ and $Er_2O_3$ are the most suitable. It is considered that these impurities stay in the grain boundaries and serve to discharge impurities from the crystal to the grain boundaries so that it becomes possible that the impurities can be locally distributed in the grain boundaries. For this reason, intergranular fracture appears in the fractured section.

It is preferable that the content of the metal oxide is 0.5 to 20 weight %.

Here, the publication of JP Kokai Hei 10-158002 discloses aluminum nitride sintered body in which SrO or CaO, and oxide of rare earth elements are added. However, in this application, the aluminum nitride sintered body is fired at 1650° C. which is relatively low temperature, and thus it is difficult to distribute the impurities locally in the grain boundaries, and thus the thermal conductivity thereof is low compared to the present invention. Also, a material with a large particle diameter is used therein and when the material is fired slowly for 3 hours at low temperature of 1650° C., large grains with a diameter of more than 10 μm are observed in the section thereof.

Further, this publication relates to a substrate for mounting a semiconductor, and does not describe nor suggest that a conductor layer is provided on a surface or inside thereof, unlike the present invention. Thus, it is noted here that this publication does not affect the patentability of the invention.

In addition, JP Kokai Hei 10-279359 discloses a ceramic which is obtained by firing oxide of rare earth metal and silicon nitride, but the firing is carried out for 3 hours at 1600° C. and this temperature is too low to distribute the impurities locally in the grain boundaries sufficiently, and thus the thermal conductivity cannot be improved. Moreover, since the ceramic is fired at low temperature so that grains grow slowly, thus a grain diameter exceeds 10 μm. Moreover, hardness and toughness value thereof is lowered therein, namely, this is designed based on an idea which is completely opposite to the idea of obtaining high toughness value in the present invention. Therefore, it is noted that this reference does not affect the patentability of the present invention.

Furthermore, the publication of JP Kokai 7-153820 discloses an aluminum nitride containing yttria and having thermal conductivity of 100 W/m·K or more, but does not describe a particle diameter of a raw material and a diameter of sintered ceramic grains and negatives the addition of impurities, and also does not refer to the annealing. Therefore, this publication does not affect the patentability of the present invention.

It is desirable that the ceramic substrate contains carbon in an amount of 5 to 5000 ppm in the present invention.

By incorporating carbon, the ceramic substrate can be blackened so that the radiation heat can be fully utilized when the ceramic substrate is used as a heater.

The carbon may be of amorphous or crystalline. In case that amorphous carbon is used, volume resistivity can be prevented from dropping at high temperature. In case that the crystalline carbon is used, thermal conductivity can be prevented from dropping at high temperature. Accordingly, both crystalline carbon and amorphous carbon may be used together depending on the purpose. The content of carbon is preferably in a range of 50 to 2000 ppm.

In case that the ceramic substrate of the first aspect of the present invention contains carbon therein, it is preferable that carbon is added so that the brightness of the aluminum nitride sintered body is N4 or less when evaluated as the value according to the definition of JIS Z 8721. The aluminum nitride sintered body having such brightness exhibits excellent heat radiation and excellently conceals the conductors and the like embedded therein.

Herein, the brightness N is defined as follows: the brightness of ideal black is made to 0; that of ideal white is made to 10; respective colors are divided into 10 parts in the manner that the brightness of the respective colors is recognized stepwise between the brightness of black and that of white at equal intensity intervals; and the resultant parts are indicated by symbols N0 to N10, respectively.

Actual brightness is measured by comparison with color chips corresponding to N0 to N10. One place of decimals in this case is made to 0 or 5.

The present invention is the ceramic substrate for a semiconductor producing/examining device, and specific examples of the devices include an electrostatic chuck, a hot plate (a ceramic heater) and a wafer prober and the like.

In case that a conductor formed in the ceramic substrate is a resistance heating element, it can be used as a ceramic heater (a hot plate).

Figure 1:
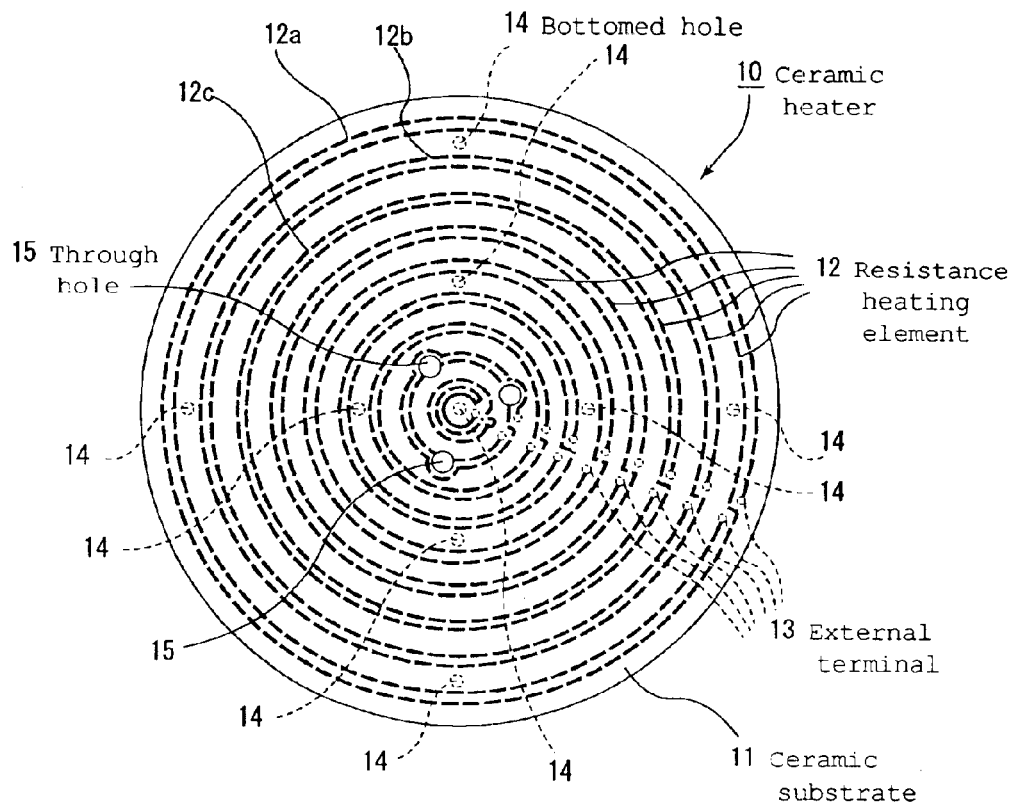
FIG. 1 is a plain view schematically showing one example of a ceramic heater using a ceramic substrate for a semiconductor producing/examining device of the present invention.
Figure 2:
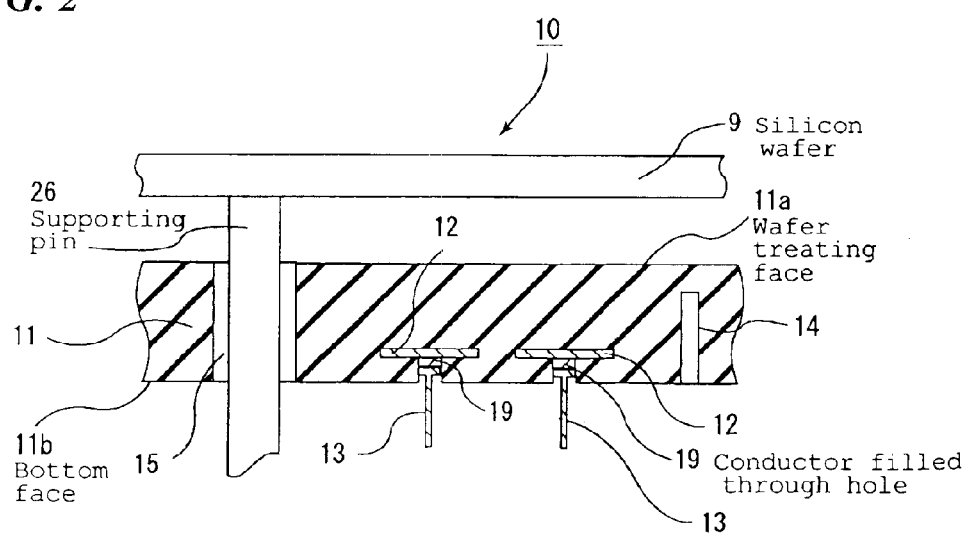
FIG. 2 is a partially enlarged sectional view of the ceramic heater shown in FIG. 1.

FIG. 1 is a plain view schematically showing one example of the ceramic heater as one embodiment of the ceramic substrate according to the ceramic substrate for a semiconductor producing/examining device of the present invention. FIG. 2 is a partially enlarged sectional view showing a part of the ceramic heater shown in FIG. 1.

A ceramic substrate 11 is formed into a disc shape, and a resistance heating element 12 as a temperature control means is formed into a concentric circles-like pattern inside the ceramic substrate 11. Moreover, the resistance heating element 12 is constituted so that, each of a pair of two adjacent concentric circles are connected, as a set of circuit, to form one line; and an external terminal 13 as the input/output terminal is connected to each end portion of the circuit through a conductor filled through hole 19.

In addition, as shown in FIG. 2, a through hole 15 is provided on the ceramic substrate 11, and a supporting pin 26 is inserted through the through hole 15 so as to support a silicon wafer 9. When the supporting pins 26 are moved in vertical direction, the silicon wafer 9 can be received from a carrier, the silicon wafer 9 can be put on a wafer treating face 11a of the ceramic substrate 11 so as to be heated, the silicon wafer 9 can be supported in a state that it is distanced from the wafer treating face 11a with an interval of about 50 to 2000 $\mu$m so as to be heated.

In addition, a bottomed hole 14 for inserting a temperature measuring element such as thermocouples is provided on a bottom face 11b of the ceramic substrate 11. When the resistance heating element 12 is energized, the ceramic substrate 11 is heated, and as a result, an object to be heated such as a silicon wafer and the like can be heated.

As for the ceramic substrate 11 constituting the ceramic heater 10, since a fractured section shows a state of intergranular fracture and has a high fracture toughness value, its thermal shock resistance is excellent. Moreover, in the ceramic substrate 11 which has gone through the annealing treatment and the like, impurities are segregated in the grain boundaries and, thus on the contrary, a purity of grain crystal becomes high. For this reason, the thermal conductivity thereof becomes 100 W/m·K or more, namely it is excellent.

In case that resistance heating element is provided inside the ceramic substrate, an opening for blowing a coolant such as air and the like as a cooling means may be provided in a supporting case into which the ceramic substrate is fitted. In case that the resistance heating element is provided inside the ceramic substrate, plural layers of them may be provided.

In this case, it is preferable that the patterns at respective layers are formed so that the patterns complement each other, whereby any portion of the heating face is covered by one of these patterns or layers without leaving any uncovered portion when viewed from the heating face side. For example, a structure having a staggered arrangement may be used.

It is desirable that the resistance heating element comprises a noble metal (gold, silver, platinum, palladium), a metal such as lead, tungsten, molybdenum and nickel and the like, or conductive ceramic such as carbide of: tungsten; and molybdenum and the like. This is because of the followings: a resistance value can be made to be high by using them; their thickness can be made thicker in order to prevent disconnection and the like; they are less likely to be oxidized; and also their thermal conductivity is less likely to drop. They may be used solely, or two or more kinds of them together.

In addition, since the temperature of the whole ceramic substrate should be made even, it is preferable that the resistance heating element has a concentric circles-like pattern shown in FIG. 1, or the shape of a combination of the concentric circles-like pattern and winding lines pattern. Moreover, it is desirable that a thickness of the resistance heating element is 1 to 50 $\mu$m, and its width is 5 to 20 mm.

By changing the thickness and width of the resistance heating element, their resistance value thereof can be changed. But the above ranges are the most practical. The resistance value of the resistance heating element become larger as the thickness become thinner, and width become narrower.

When the resistance heating element is provided inside, a distance between the heating face and the resistance heating element becomes shorter, and thus evenness of the temperature on the surface becomes worse. For this reason, it is necessary to widen the width of the resistance heating element. Also, since the resistance heating element is provided inside the ceramic substrate, there is no necessity of taking the adhesion to the ceramic substrate into consideration.

Shape of section of the resistance heating element may be rectangular, elliptic, spindle-shaped, or semicylindrical. The section is desirably flat. This is because; if the section is flat, heat is likely to be radiated toward the heating face, so that the amount of heat transmitted to the heating face can be made large. Thus, temperature distribution in the heating face is not easily formed. The shape of the resistance heating element may be a spiral shape.

When the resistance heating element is formed inside the ceramic substrate, it is desirable that they are formed in a domain extending up to 50% in the direction of thickness from the bottom face. This is because the temperature-distribution on the heating face is eliminated, and the semiconductor wafer can be heated evenly.

In order to form the resistance heating element on the bottom face or the inside of the ceramic substrate for a semiconductor device of the present invention, it is preferable that conductor containing paste comprising metal or conductive ceramic is used.

Namely, in case that the resistance heating element is formed on the bottom face of the ceramic substrate, normally, after the firing is carried out and the ceramic substrate is produced, the conductor containing paste layer is formed on the surface thereof and the ceramic substrate is fired so that the resistance heating element is formed.

On the other hand, as shown in FIGS. 1, 2, in case that the resistance heating element 12 is formed inside the ceramic substrate 11, after the conductor containing paste layer is formed on a green sheet, the green sheet is heated and pressurized with another green sheet so as to be integrated together to produce a green sheet lamination. Thereafter, the lamination is fired so that the resistance heating element can be formed inside the ceramic substrate.

The abovementioned conductor containing paste is not particularly limited, but it is preferable that it includes metal particles or conductive ceramic particles in order to secure electrical conductivity, and includes resin, solvent, thickener and the like.

Examples of materials of the metal particles and the conductive ceramic particles are mentioned above. It is preferable that a particle diameter of the metal particle or the conductive ceramic particles is 0.1 to 100 $\mu$m. When the particle diameter is less than 0.1 $\mu$m, namely, too fine, the particles are easily oxidized. Meanwhile, when the particle diameter exceeds 100 $\mu$m, the particles are less likely to be sintered, and the resistance value becomes large.

Shape of the metal particles may be of spherical or scaly. In case that these metal particles are used, mixture of the spherical and scaly particles may be used.

In case that the metal particles are the scaly particles or the mixture of the spherical and scaly particles, metal oxide between the metal particles can be easily retained, and the close contact between the resistance heating element and the ceramic substrate is ensured, and the resistance value can be large. For these reasons, they are advantageous.

As the resin to be used in the conductor containing paste, an acrylic resin, an epoxy resin, a phenol resin and the like is used. Moreover, as the solvent, isopropyl alcohol and the like is used. As the thickener, cellulose and the like is used.

When the conductor containing paste for the resistance heating element is formed on the surface of the ceramic substrate, it is preferable that metal oxide as well as the above-mentioned metal particles are added into the conductor containing paste, and the metal particles and the metal oxide are sintered. By thus sintering the metal oxide together with the metal particles, the ceramic substrate and the metal particles can be adhered more closely.

The reason for the improvement in the adhesion with the ceramic substrate due to the mixing of the metal oxide is not clear. However, it is considered that the surfaces of the metal particles and the surface of the ceramic substrate composed of non-oxide are slightly oxidized so that oxide films are formed thereon, and the oxide films are sintered to be integrated with one another through the metal oxide, and the metal particles and ceramic adhere to each other. Moreover, in case that the ceramic constituting the ceramic substrate is an oxide, since the surface is naturally composed of an oxide, the conductor layer having excellent adhesion is formed.

As the abovementioned metal oxide, at least one kind which is selected from a group consisting of lead oxide, zinc oxide, silica, boron oxide ($B_2O_3$), alumina, yttria and titania is preferable.

This is because these oxide can improve the adhesion between the metal particles and the ceramic substrate without increasing the resistance value of the resistance heating element too much.

The proportion of lead oxide, zinc oxide, silica, boron oxide ($B_2O_3$), alumina, yttria and titania are preferably 1 to 10 parts by weight for lead oxide, 1 to 30 parts by weight for silica, 5 to 50 parts by weight for boron oxide, 20 to 70 parts by weight for zinc oxide, 1 to 10 parts by weight for alumina, 1 to 50 parts by weight for yttria and 1 to 50 parts by weight for titania, with respect to the whole weight of the metal oxides expressed as 100 parts by weight. It is preferable that the contents of the metal oxides are adjusted in the manner that the total sum of the metal oxides does not exceed 100 parts by weight, because these metal oxides can especially improve adhesion to the ceramic substrate when being used in such a range.

It is preferable that an addition amount of the metal oxide to the metal particles is 0.1 weight % or more and less than 10 weight %. Moreover, it is preferable that area resistivity when the resistance heating element is formed by using the conductor containing paste having such a structure is 1 to 45 mΩ/□.

When the area resistivity exceeds 45 mΩ/□, a calorific value becomes so large with respect to an applied voltage amount that the calorific value is hard to be controlled in the ceramic substrate for a semiconductor device having the resistance heating element provide on the surface thereof. Incidentally, when the addition amount of the metal oxide is more than 10 weight %, the area resistivity exceeds 50 mΩ/□ and the calorific value becomes too large, thus the temperature thereof is difficult to be controlled, and the evenness of the temperature distribution deteriorates.

In case that the resistance heating element is formed on the surface of the ceramic substrate, it is preferable that a metal covering layer is formed on the surface of the resistance heating element. This is because the change of resistance value due to oxidation of the metal sintered body can be prevented. It is preferable that a thickness of the metal covering layer to be formed is 0.1 to 10 μm.

The metal to be used when the metal covering layer is formed is not limited as long as it is non-oxidizable metal. More specifically, for example, gold, silver, palladium, platinum, nickel and the like is used. These may be used solely or two kinds of them may be combined. The nickel is preferable among them.

In case that the resistance heating element is formed inside the ceramic substrate, since the surfaces of the resistance heating element is not oxidized, thus covering is not necessary.

In case that the conductor formed inside the ceramic substrate is an electrostatic electrode layer, the ceramic substrate can be used as an electrostatic chuck. In this case, an RF electrode and the resistance heating element may be formed under the electrostatic electrode as conductors inside the ceramic substrate.

Figure 3:
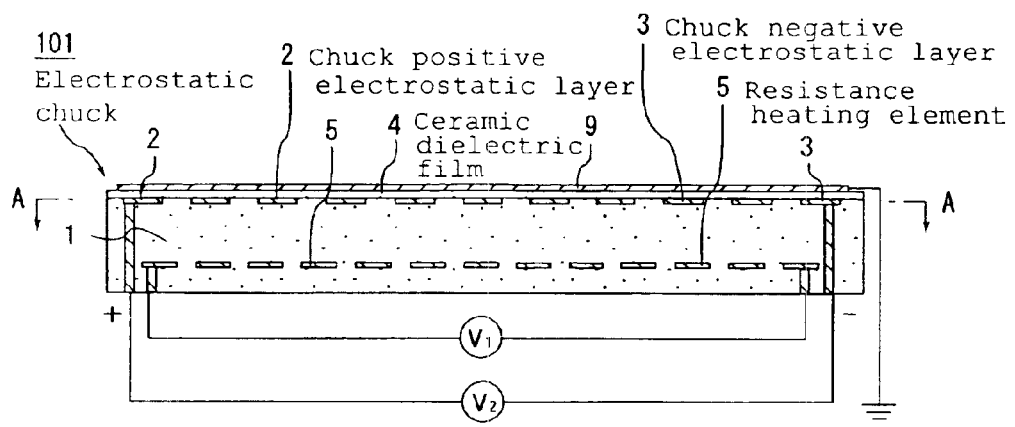
FIG. 3 is a sectional view schematically showing one example of an electrostatic chuck using a ceramic substrate for a semiconductor producing/examining device of the present invention.
Figure 4:
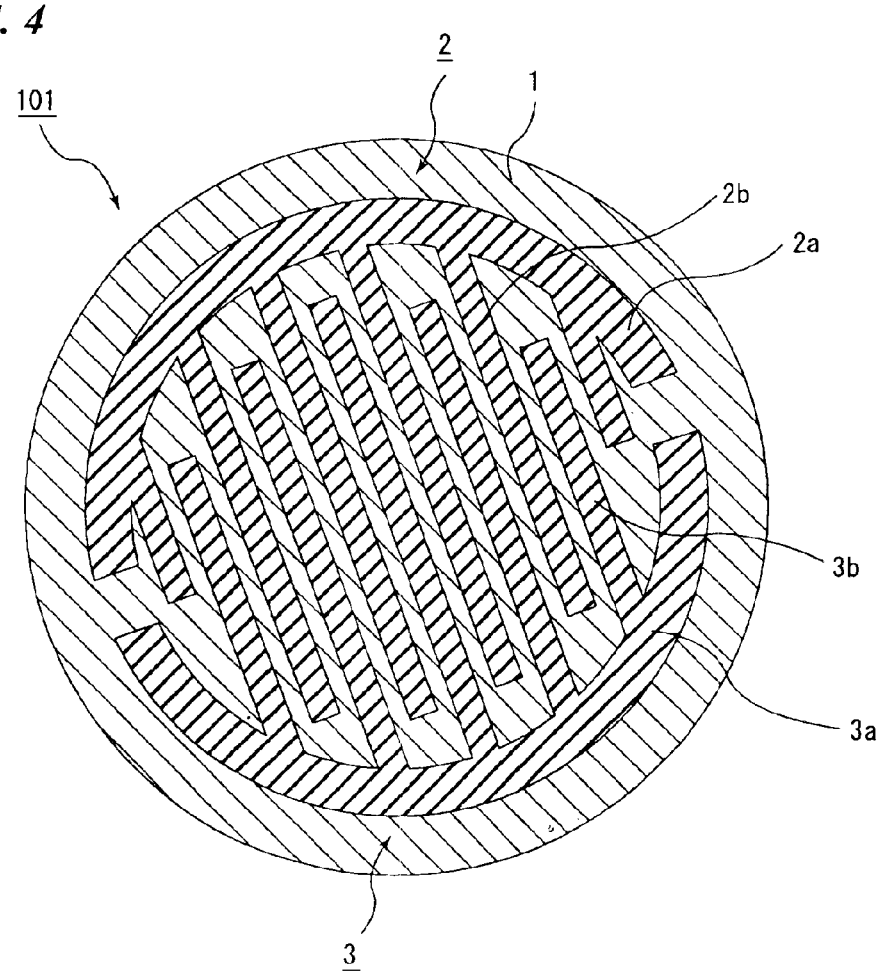
FIG. 4 is a sectional view taken along line A—A of the electrostatic chuck shown in FIG. 3.

FIG. 3 is a longitudinal sectional view schematically showing the electrostatic chuck according to one embodiment of the present invention. FIG. 4 is a sectional view taken along line A—A of the electrostatic chuck in FIG. 3.

In this electrostatic chuck 101, an electrostatic electrode layer, which is composed of a chuck positive electrostatic layer 2 and a chuck negative electrostatic layer 3, is embedded inside the disc-shaped ceramic substrate 1. A thin ceramic layer 4 (hereinafter, referred to as a ceramic dielectric film) is formed on the electrostatic electrode layer. Moreover, the silicon wafer 9 is put on the electrostatic chuck 101 and grounded.

As shown in FIG. 4, the chuck positive electrostatic layer 2 is composed of a semicircular arc part 2a and a comb teeth-shaped part 2b, and the chuck negative electrostatic layer 3 is also composed of a semicircular arc part 3a and a comb teeth-shaped part 3b. The chuck positive electrostatic layer 2 and the chuck negative electrostatic layer 3 are arranged so as to face each other in a state that the comb teeth-shaped sections 2b and 3b cross each other. The chuck positive electrostatic layer 2 and the chuck negative electrostatic layer 3 are connected to a + side and a − side of DC power source respectively so that a DC voltage $V_2$ is applied thereto.

In addition, in order to control the temperature of the silicon wafer 9, the resistance heating element 5 having a concentric circles-like pattern as viewed from the above, as shown in FIG. 1 is provided inside the ceramic substrate 1. External terminals are connected and fixed to both ends of the resistance heating element 5 so that a voltage $V_1$ is applied thereto. Also, not shown in FIGS. 3 and 4, but a bottomed hole for inserting temperature measuring element therein and a through hole for inserting a supporting pin (not shown) supporting and moving the silicon wafer 9 in vertical direction therein are formed in the ceramic substrate 1 as shown in FIGS. 1 and 2. Incidentally, the resistance heating element may be formed on the bottom face of the ceramic substrate.

When this electrostatic chuck 101 functions, a DC voltage $V_2$ is applied to the chuck positive electrostatic layer 2 and the chuck negative electrostatic layer 3. As a result, the silicon wafer 9 is adsorbed and fixed to the electrodes through the ceramic dielectric film 4 by electrostatic action of the chuck positive electrostatic layer 2 and the chuck negative electrostatic layer 3. After the silicon wafer 9 is fixed onto the electrostatic chuck 101 in such a manner, the silicon wafer 9 is subjected to various processes such as CVD and the like.

In the ceramic substrate 11 constituting the electrostatic chuck 101, since the fractured section shows the state of intergranular fracture and the fracture toughness value is high, the thermal shock resistance is excellent. Moreover, by subjecting the ceramic substrate to the annealing treatment and the like, the ceramic substrate has excellent thermal conductivity.

In the electrostatic chuck 101, it is desirable that the ceramic dielectric film 4 comprises a nitride ceramic including oxygen, and the porosity thereof is 5% or less, and the maximum pore diameter is 50 µm or less. Moreover, it is desirable that the pores in the ceramic dielectric film 4 are composed of pores which are independent of each other.

In the ceramic dielectric film 4 having such a structure, gas and the like which lowers a breakdown voltage does not permeate the ceramic dielectric film, and thus corrosion of the electrostatic electrodes can be prevented and the drop of the breakdown voltage of the ceramic dielectric film does not occur even at a high temperature.

As the temperature control means, besides the resistance heating element, Peltier devices (reference to FIG. 7) 12 can be used.

In case that the Peltier devices are used as the temperature control means, they are advantageous because they can conduct both heating and cooling by changing a flowing direction of electric currents.

Figure 7:
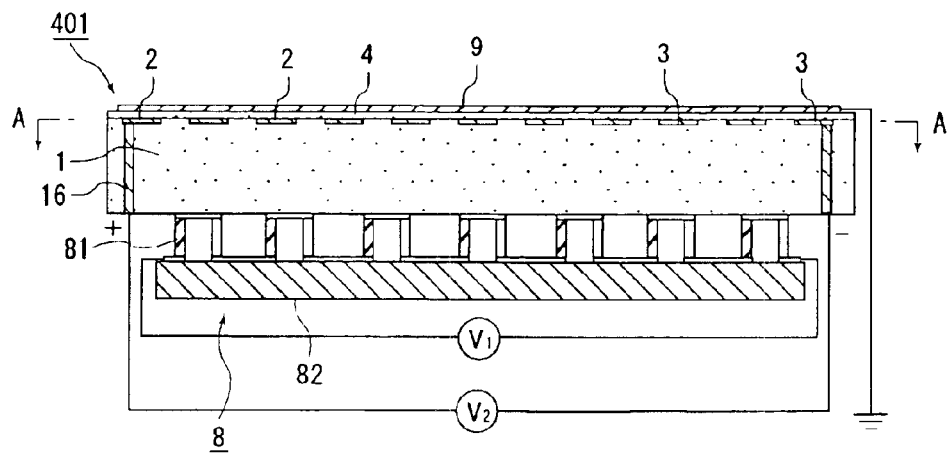
FIG. 7 is a sectional view schematically showing one example of an electrostatic chuck using a ceramic substrate for a semiconductor producing/examining device of the present invention.

As shown in FIG. 7, the Peltier devices 8 are formed in such a manner that p type and n type thermoelectric elements 81 are connected in series so as to be attached to a ceramic plate 82 and the like. Examples of the Peltier device include the silicon/germanium-type, the bismuth/antimony-type, the lead/tellurium-type and the like.

The electrostatic chuck of the present invention has the structure shown in FIGS. 3,4, for example. The material and the like of the ceramic substrate has been already described, subsequently, respective members constituting the electrostatic chuck and another embodiments of the electrostatic chuck of the present invention will be detailed below in the following description.

A material of the ceramic dielectric film constituting the electrostatic chuck of the present invention is not particularly limited, and an oxide ceramic, a nitride ceramic ceramic and the like can be used. Among them the nitride ceramic is preferable.

As the nitride ceramic, one which is the same as the ceramic substrate can be used, but it is desirable that the nitride ceramic includes oxygen. Moreover, the ceramic dielectric film is sintered so that intergranular fracture appears on the fractured section similarly to the ceramic substrate. This is because thermal shock resistance and thermal conductivity improves.

In order to incorporate oxygen into the above-mentioned nitride ceramic, metal oxide is mixed with raw material powder of the nitride ceramic and then, they are fired.

Examples of the metal oxide include alumina ($Al_2O_3$) silicon oxide ($SiO_2$) and the like.

It is preferable that an addition amount of the metal oxide is 0.1 to 10 parts by weight with respect to 100 parts by weight of the nitride ceramic.

A thickness of the ceramic dielectric film is set to 50 to 5000 µm so that a sufficient breakdown voltage can be secured without lowering chuck force.

When the thickness of the ceramic dielectric film is less than 50 µm, thus the thickness is too thin, a sufficient breakdown voltage cannot be obtained. Moreover, when the silicon wafer is put and adsorbed, insulation breakdown occasionally occurs in the ceramic dielectric film. Meanwhile, when the thickness of the ceramic dielectric film exceeds 5000 µm, thus a distance between the silicon wafer and the electrostatic electrode becomes distant, an ability to adsorb the silicon wafer is lowered. It is preferable that the thickness of the ceramic dielectric film is 100 to 1500 µm.

It is preferable that the porosity of the ceramic dielectric film is 5% or less, and a diameter of the maximum pore is 50 µm or less.

When the porosity exceeds 5%, the number of pores increases, and the pore diameter becomes too large. As a result, the pores are easily interconnected to one another. In the ceramic dielectric film having such a structure, the breakdown voltage drops.

Further, when the diameter of the maximum pore exceeds 50 µm, even if an oxide exists in the grain boundaries, a breakdown voltage cannot be secured at high temperature. It is preferable that the porosity is 0.01 to 3%, and the diameter of the maximum pore is 0.1 to 10 µm.

It is desirable that the ceramic dielectric film contains 50 to 5000 ppm of carbon. This is because the electrode pattern provided in the electrostatic chuck can be concealed and high radian the at can be obtained. In addition, as volume resistivity drops, the ability to adsorb the silicon wafer becomes higher in a low temperature range.

In the present invention, a certain number of pores may exist in the ceramic dielectric film because the fracture toughness value becomes higher thereby. As a result, the thermal shock resistance can be further improved.

As the electrostatic electrodes, for example, sintered body of metal or conductive ceramic, metal foil and the like can be used. It is preferable that the metal sintered body is composed of at least one kind selected from tungsten and molybdenum. It is desirable that the metal foil is composed of the same material as the metal sintered body. The reason for this is that these metals exhibit relatively good resistance to oxidation and have sufficient conductivity to function as an electrode. As the conductive ceramic, at least one kind selected from carbides of: tungsten; and molybdenum is preferably used.

Figure 9:
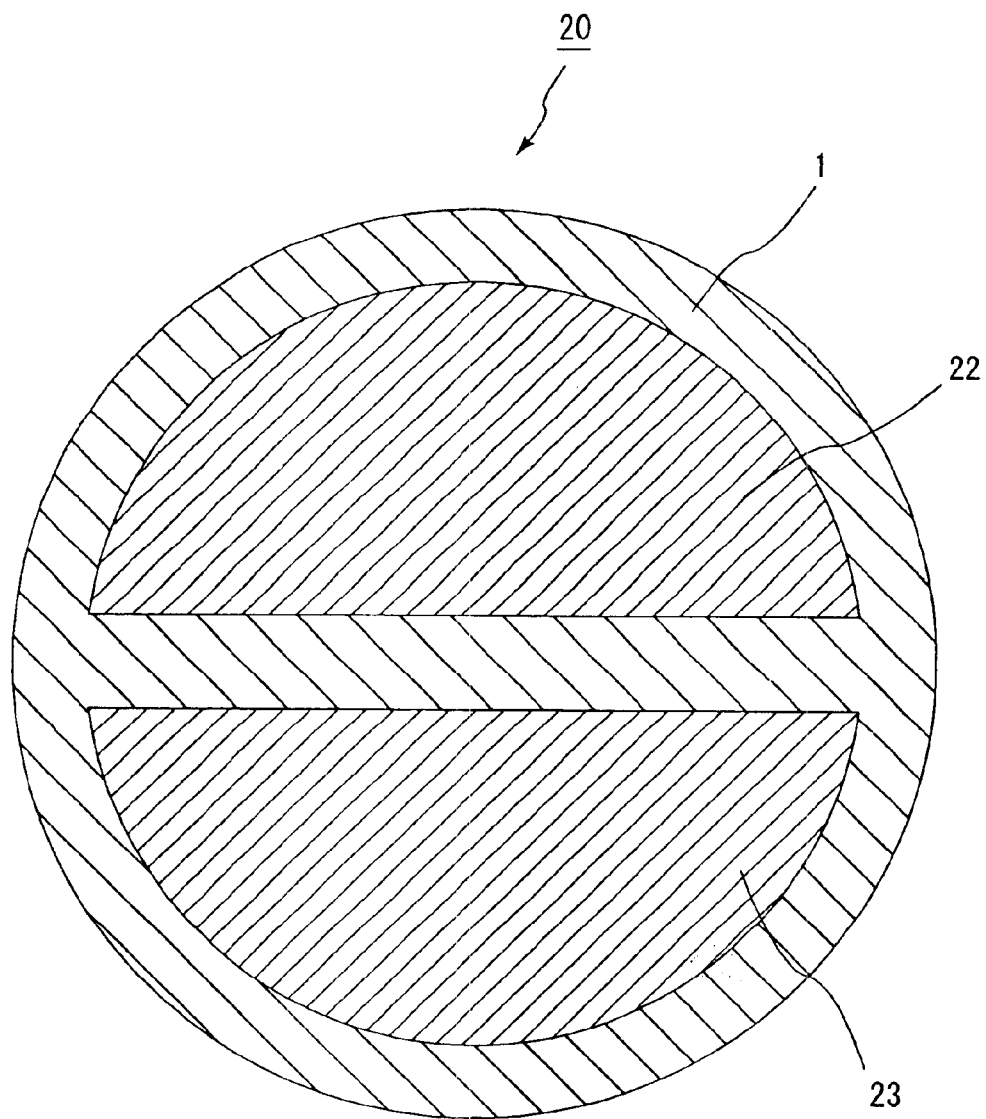
FIG. 9 is a horizontal sectional view schematically showing a shape of an electrostatic electrode constituting the electrostatic chuck of the present invention.
Figure 10:
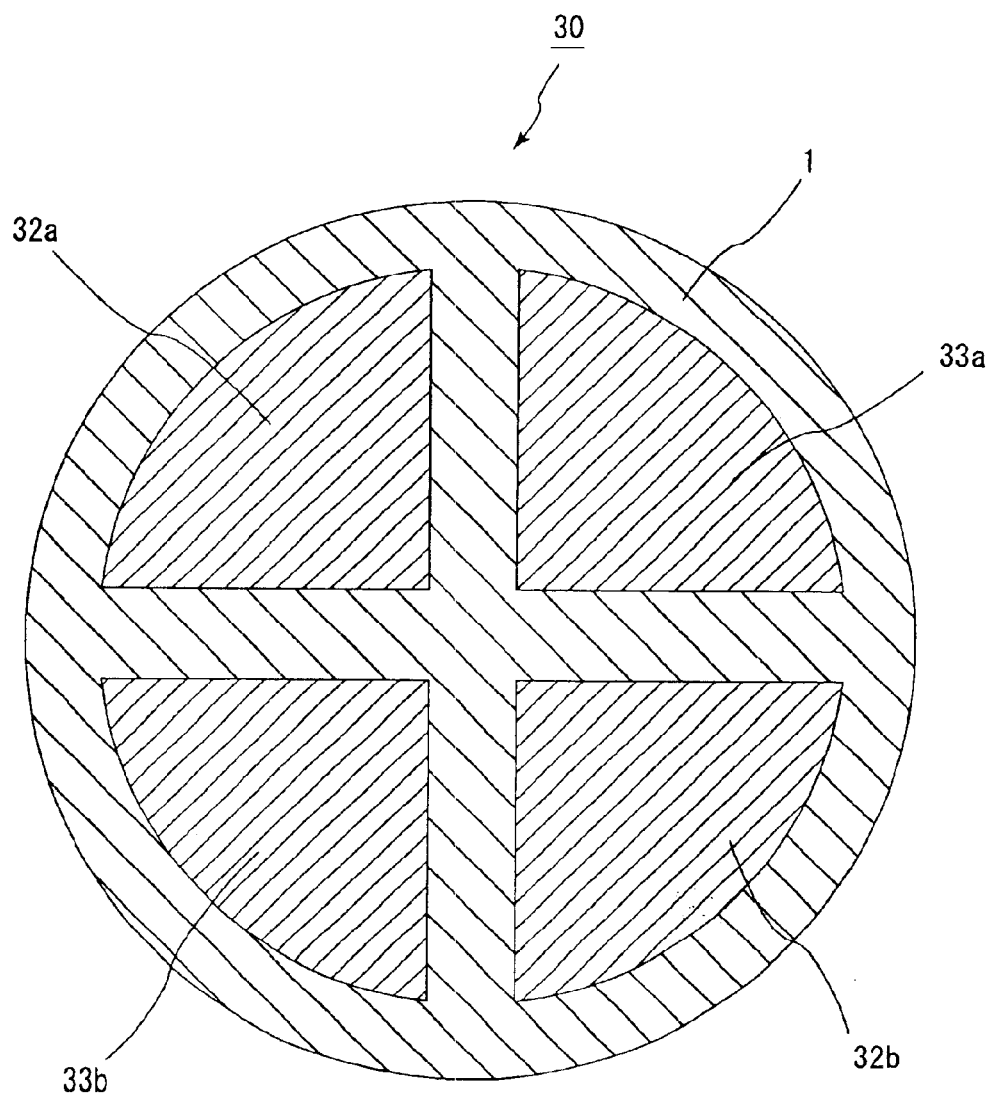
FIG. 10 is a horizontal sectional view schematically showing a shape of an electrostatic electrode constituting the electrostatic chuck of the present invention.

FIGS. 9,10 are horizontal sectional views schematically showing the electrostatic electrodes in another electrostatic chuck. In the electrostatic chuck 20 shown in FIG. 9, a semicircular chuck positive electrostatic layer 22 and a chuck negative electrostatic layer 23 are formed inside the ceramic substrate 1. In the electrostatic chuck shown in FIG. 10, chuck positive electrostatic layers 32a and 32b and chuck negative electrostatic layers 33a and 33b which are obtained by dividing a circle into four are formed inside the ceramic substrate 1. Moreover, the two chuck positive electrostatic layers 22a and 22b and the two chuck negative electrostatic layers 33a and 33b are formed so as to cross each other.

In case that electrodes which are obtained by dividing a circular electrode is formed, a number of division is not particularly limited, it may be five or more, and their shape is not limited to a sector.

Figure 5:
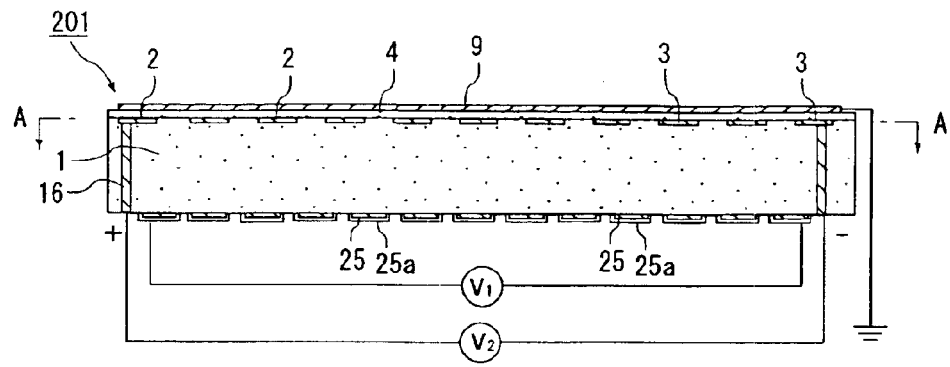
FIG. 5 is a sectional view schematically showing one example of an electrostatic chuck using a ceramic substrate for a semiconductor producing/examining device of the present invention.
Figure 6:
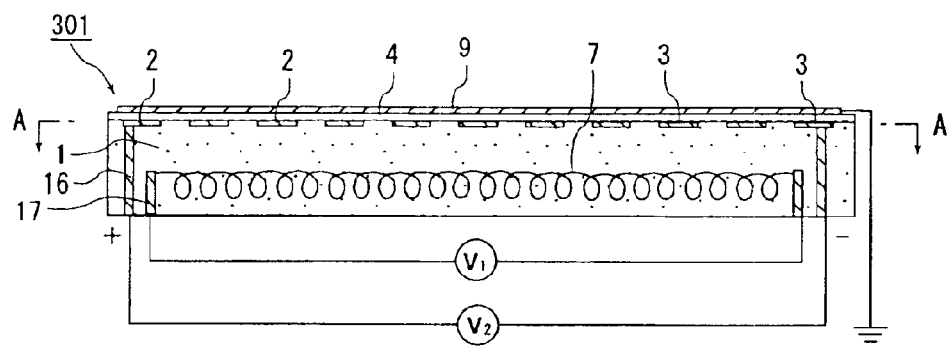
FIG. 6 is a sectional view schematically showing one example of an electrostatic chuck using a ceramic substrate for a semiconductor producing/examining device of the present invention.

Examples of the electrostatic chuck of the present invention include followings, for example: as shown in FIG. 3, the electrostatic chuck 101 which is constituted such that the chuck positive electrostatic layer 2 and the chuck negative electrostatic layer 3 are provided between the ceramic substrate 1 and the ceramic dielectric film 4, and the resistance heating element 5 is provided inside the ceramic substrate 1; as shown in FIG. 5, an electrostatic chuck 201 which is constituted such that the chuck positive electrostatic layer 2 and the chuck negative electrostatic layer 3 are provided between the ceramic substrate 1 and the ceramic dielectric film 4, and a resistance heating element 25 is provided on the bottom face of the ceramic substrate 1; as shown in FIG. 6, an electrostatic chuck 301 which is constituted such that the chuck positive electrostatic layer 2 and the chuck negative electrostatic layer 3 are provided between the ceramic substrate 1 and the ceramic dielectric film 4, and a metal wire 7 as the resistance heating element is embedded inside the ceramic substrate 1; as shown in FIG. 7, an electrostatic chuck 401 which is constituted such that the chuck positive electrostatic layer 2 and the chuck negative electrostatic layer 3 are provided between the ceramic substrate 1 and the ceramic dielectric film 4, and a Peltier device 8 which is composed of a thermoelectric element 81 and a ceramic plate 82 is formed on the bottom face of the ceramic substrate 1; and the like.

In the ceramic substrate constituting such electrostatic chucks, the fractured face shows a state of intergranular fracture and the fracture toughness value is large. For these reasons, the substrate has excellent thermal shock resistance.

As shown in FIGS. 3 to 7, in the present embodiment, the chuck positive electrostatic layer 2 and the chuck negative electrostatic layer 3 are provided between the ceramic substrate 1 and the ceramic dielectric film 4, and the resistance heating element 5 and the metal wire 7 are formed inside the ceramic substrate 1. Thus, connecting units (conductor filled through holes) 16, 17 for connecting to external terminals are required.

The conductor filled through holes 16, 17 are formed by filling high-melting metal such as tungsten paste and molybdenum paste and the like, and conductive ceramic such as tungsten carbide and molybdenum carbide and the like.

In addition, it is preferable that a diameter of the connecting units (conductor filled through holes) 16, 17 is 0.1 to 10 mm. This is because crack and distortion can be prevented while preventing a disconnection.

Figure 8A:
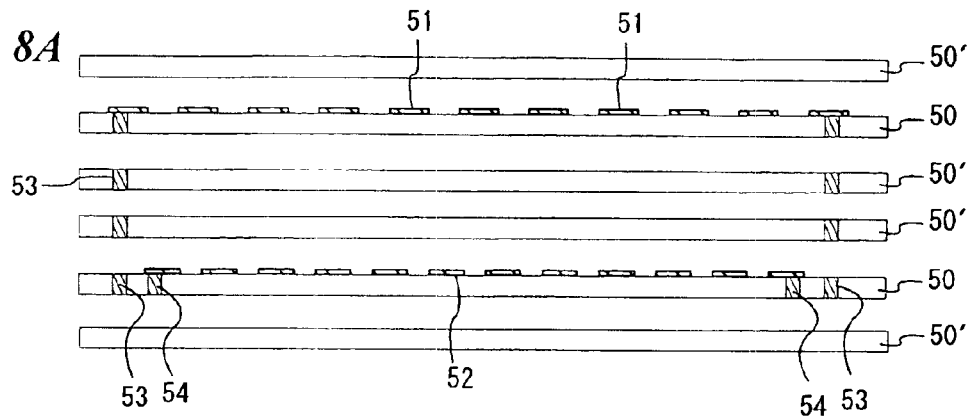
FIGS. 8(a) to (d) are sectional views schematically showing a part of the steps of producing the electrostatic chuck shown in FIG. 5.
Figure 8B:
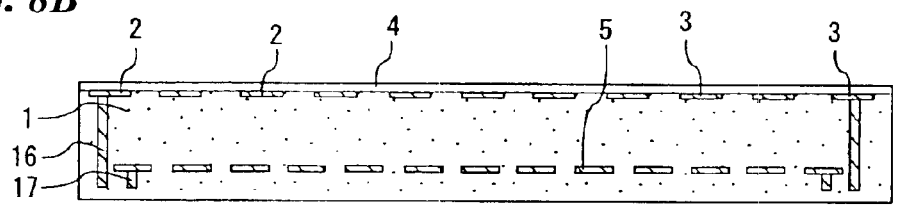
Figure 8C:
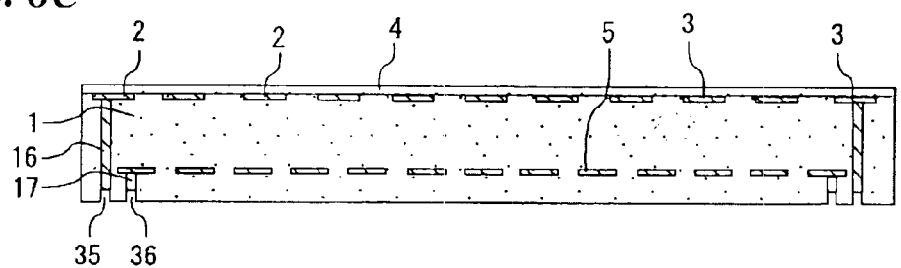
Figure 8D:
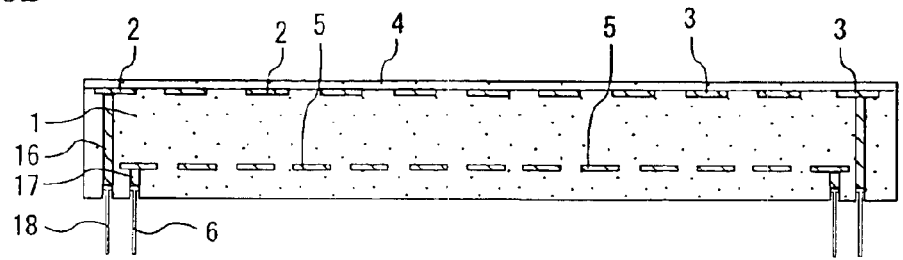

The external terminals 6,18 are connected thereto by using the conductor filled through holes as connection pads (reference to FIG. 8(d)).

The connection is carried out by using solder and blazing material. As the blazing material, silver blaze, palladium blaze, aluminum blaze and gold blaze are used. As the gold blaze, Au—Ni alloy is desirable. This is because Au—Ni alloy has excellent adhesion with tungsten.

It is desirable that a ratio of Au/Ni is [81.5 to 82.5 (weight %)]/[18.5 to 17.5 (weight %)].

It is desirable that a thickness of an Au—Ni layer is 0.1 to 50 $\mu$m. This is because a reliable connection is obtained when the thickness of the Au—Ni layer is within this range. Moreover, when Au—Cu metal alloy is used at a high vacuum of $10^{-6}$ to $10^{-5}$ Pa and at a high temperature of 500 to 1000° C., the Au—Cu alloy is deteriorated, but the Au—Ni metal alloy is advantageous because such deterioration does not occur. Moreover, it is desirable that a quantity of an impurity element in the Au—Ni alloy is less than 1 part by weight when the whole quantity is expressed as 100 parts by weight.

In the present invention, a thermocouple can be embedded in the bottomed hole of the ceramic substrate if necessary. The temperature of the resistance heating element is measured by the thermocouple, and a voltage and an electric current flow are changed based on the measured data so that the temperature can be controlled.

It is desirable that the size of the connecting portions between the thermocouples and the metal wires is the same as or larger than a strand diameter of the metal wires, and is 0.5 mm or less. With such a structure, a heat capacity of the connecting portions becomes small, and the temperature can be converted into an electric current value accurately and quickly. For this reason, the temperature controllability is improved, and the temperature distribution on the heating face of the wafer becomes small.

As the thermocouples, for example, as described in JIS-C-1602 (1980), K type, R type, B type, S type, E type J type and T type thermocouples can be used.

Figure 11:
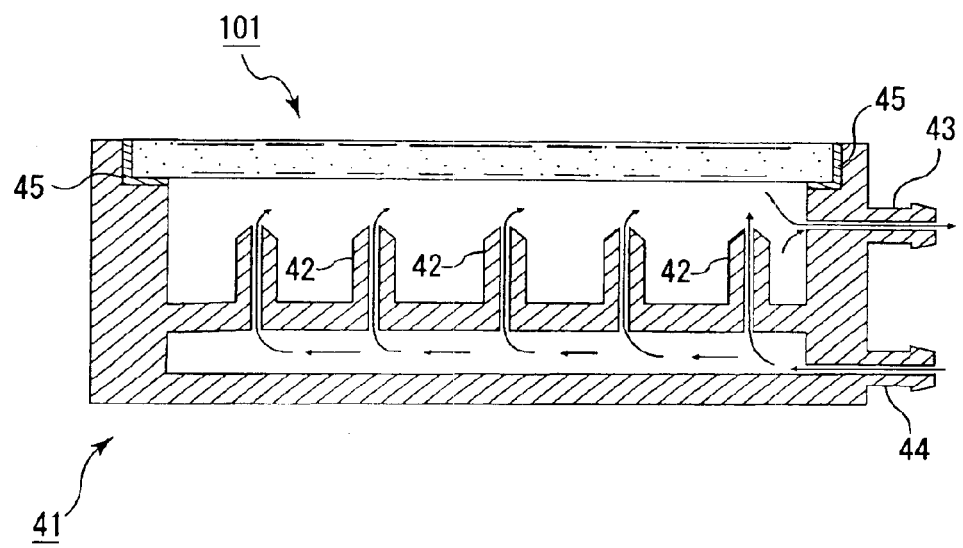
FIG. 11 is a sectional view schematically showing a state that the electrostatic chuck of the present invention is fitted into a supporting case.

FIG. 11 is a sectional view schematically showing a supporting case 41 for fitting the electrostatic chuck of the present invention having the abovementioned structure thereinto.

The electrostatic chuck 101 is fitted into the supporting case 41 through a heat insulating material 45. Moreover, a coolant outlet 42 is formed on the supporting case 11 such that a coolant is introduced from a coolant inlet 44 and is discharged outside from an inhalation duct 43, by passing through the coolant outlet 42. By the action of the coolant, the electrostatic chuck 101 can be cooled.

Next, a method of producing an electrostatic chuck which is one example of the ceramic substrate for a semiconductor producing/examining device of the present invention will be explained below with reference to sectional views of FIGS. 8(a) to (d).

(1) Firstly ceramic powder such as nitride ceramic and carbide ceramic and the like is mixed with binder and solvent so that a green sheet 50 is obtained.

As the abovementioned ceramic powder, for example, aluminum nitride powder, which is heated at 500 to 1000° C. in nitrogen and hydrogen airflow so as to be subjected to a reduction process, and the like can be used. Moreover, an impurity such as boron nitride and the like can be added in a range of 0.05 to 50 ppm (in weight). It is preferable that an average particle diameter of the raw material powder is 0.1 to 1 $\mu$m.

Here, a plurality of green sheets or one green sheet 50', which are/is laminated on the green sheet on which an electrostatic electrode layer printed body 51, mentioned later, is formed, are/is to be the ceramic dielectric film 4. For this reason, the green sheets/green sheet 50' may have a composition different from that of the ceramic substrate if necessary.

However, normally, it is desirable that the material of the ceramic dielectric film 4 is the same as the material of the ceramic substrate 1. This is because: since they are sintered together in most cases, their firing conditions are the same. However, in case that the materials are different, the method in which: the ceramic substrate is firstly produced and the electrostatic electrode layer is formed thereon, and the ceramic dielectric film is further formed thereon, can be adopted.

In addition, as the binder, at least one kind selected from acrylic binder, ethyl cellulose, butylcellosolve and polyvinyl alcohol is desirable.

Further, as the solvent, at least one kind selected from α-terpineol and glycol is desirable.

Paste which is obtained by mixing them is formed into a sheet shape by a doctor blade method so that the green sheet 50 is produced.

Through holes for inserting supporting pins for the silicon wafer thereinto, concave portions for embedding the thermocouples, and through holes at portions where conductor filled through holes are formed and the like can be provided on the green sheet 50, if necessary. The through holes can be formed by punching.

It is preferable that a thickness of the green sheet 50 is about 0.1 to 5 mm.

Next, conductor containing paste is filled into the through holes of the green sheet 50 so that conductor filled through hole printed bodies 53 and 54 are obtained, and conductor containing paste which is to be electrostatic electrode layers and resistance heating element is printed on the green sheet 50.

Printing is carried out so that a desired aspect ratio is obtained by taking shrinking rate of the green sheet 50 into consideration, and whereby, the electrostatic electrode layer printed bodies 51 and the resistance heating element layer printed bodies 52 are obtained.

The printed body is formed by printing conductor containing paste including metal particles and the like.

As conductive ceramic particles included in the conductor containing paste, a carbide of: tungsten; or molybdenum are the most suitable. This is because they are less likely to be oxidized, and the thermal conductivity is less likely to drop.

In addition, as the metal particles, for example, tungsten, molybdenum, platinum, nickel and the like can be used.

It is preferable that an average particle diameter of the conductive particles and the metal particles is 0.1 to 5 $\mu$m. This is because when these particles are too large or too small, it is difficult to conduct printing with such a conductor containing paste.

As such paste, conductor containing paste, which is prepared by mixing 85 to 97 parts by weight of metal particles or conductive ceramic particles, 1.5 to 10 parts by weight of at least one kind of binder selected from acryl type, ethyl cellulose, butylcellosolve and polyvinyl alcohol, and 1.5 to 10 parts by weight of at least one kind of solvent selected from $\alpha$-terpineol, glycol, ethyl alcohol and butanol, is the most suitable.

Next, as shown in FIG. 8(*a*), the green sheet 50 having the printed bodies 51, 52, 53 and 54 and the green sheet 50' not having printed body are laminated. The green sheet 50', which does not have a printed body, is laminated on side on which a resistance heating element is formed in order to prevent end surfaces of the conductor filled through holes from being exposed and oxidized at the time of firing for forming the resistance heating element. If the firing for forming the resistance heating element is carried out in a state that the end surfaces of the conductor filled through holes are exposed, metal such as nickel which is less likely to be oxidized should be sputtered. Further preferably, the end surfaces may be preferably covered with gold blaze of Au—Ni.

(2) Next, as shown in FIG. 8(*b*), the lamination is heated and pressurized so that a lamination of the green sheets is formed.

Thereafter, the green sheets and the conductor containing paste are sintered. It is preferable that a firing temperature is 1700 to 2000° C. and a pressure of the pressurizing at the time of firing is 100 to 200 kg/cm². The heating and pressurizing are carried out in atmosphere of inert gas. As the inert gas, argon, nitrogen, and the like can be used. At this firing step, the conductor filled through holes 16, 17; the chuck positive electrostatic layer 2, the chuck negative electrostatic layer 3, the resistance heating element 5 and the like in which the section of the end portions has an aspire shape are formed.

Here, it is desirable that the firing temperature is 1700° C. or more. When the temperature is lower than 1700° C., it is difficult to discharge impurities out of crystal even by annealing thereafter.

In the present invention, after the ceramic substrate is produced by the above method, it is preferable that the ceramic substrate is subjected to the annealing treatment at 1400 to 2000° C. for 0.5 to 6 hours. As a result, impurities such as oxygen included in crystal grains are discharged out of the crystal and segregated in the grain boundaries, and the fractured section shows the state of intergranular fracture, and the thermal conductivity is improved.

(3) Next, as shown in FIG. 8(*c*), blind holes 35, 36 for connecting external terminals are provided.

It is desirable that inner walls of the blind holes 35, 36 are at least partially conductive, and the conductive inner walls are connected to the chuck positive electrostatic layer 2, the chuck negative electrostatic layer 3, the resistance heating element 5 and the like.

(4) Finally, as shown in FIG. 8(*d*), external terminals 6, 18 are provided in blind holes 35 and 36 through gold blaze. Further, bottomed holes are provided if necessary, and thermocouples can be embedded therein.

As solder, alloy such as silver-lead, lead-tin or bismuth-tin and the like can be used. It is desirable that the thickness of the solder layer is 0.1 to 50 $\mu$m. This is because: this is a range for securing connection by means of the solder sufficiently.

The above explanation exemplified the electrostatic chuck 101 (reference to FIG. 3), but in case that the electrostatic chuck 201 (reference to FIG. 5) is produced, after a ceramic plate having an electrostatic electrode layer is produced, conductor containing paste is printed on the bottom face of the ceramic plate and the plate is fired and thus resistance heating element 25 is formed. Thereafter, a metal layer 25*a* maybe formed by electroless plating and the like. Moreover, in case that the electrostatic chuck 301 (reference to FIG. 6) is produced, a metal foil or a metal wire is embedded as the electrostatic electrodes or resistance heating element in the ceramic powder so as to be sintered. Further, in case that the electrostatic chuck 401 (reference to FIG. 7) is produced, after a ceramic plate having an electrostatic electrode layer is produced, a Peltier device may be joined to the ceramic plate through a metallized metal layer.

In case that the conductor is provided on the surface or the inside of the ceramic substrate; the conductor layer on the surface is a chuck top conductor layer; and the conductor inside is at least one of a guard electrode or a ground electrode, the ceramic substrate for a semiconductor producing/examining device of the present invention functions as the wafer prober.

Figure 12:
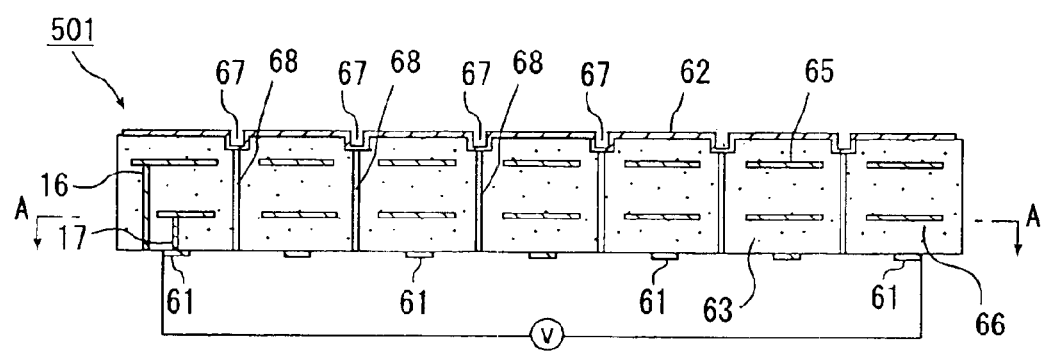
FIG. 12 is a sectional view schematically showing a wafer prober using the ceramic substrate for a semiconductor producing/examining device of the present invention.
Figure 13:
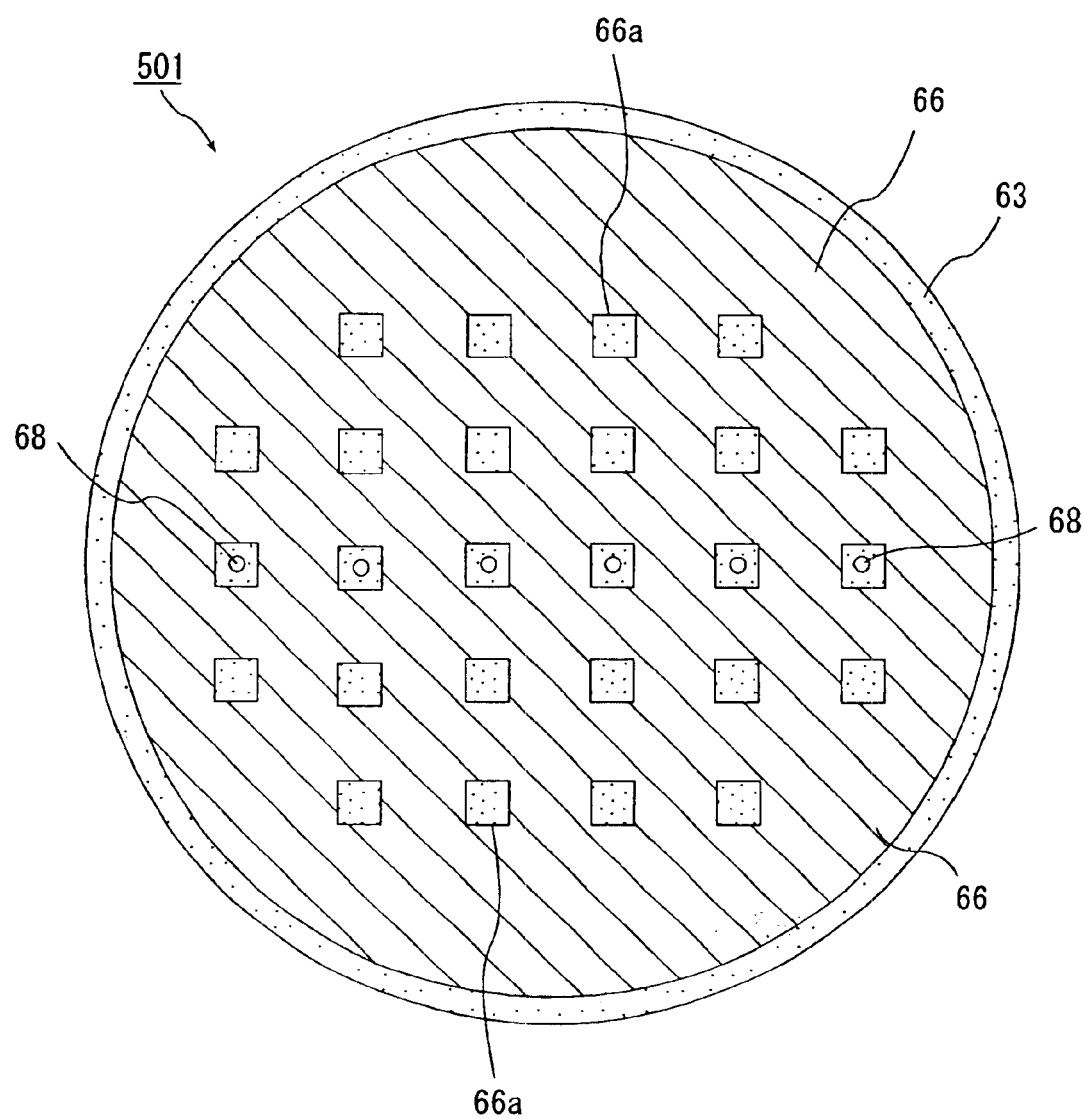
FIG. 13 is a sectional view schematically showing a guard electrode of the wafer prober shown in FIG. 12.

FIG. 12 is a sectional view schematically showing one embodiment of the wafer prober according to the present invention. FIG. 13 is a sectional view taken along line A—A of the wafer prober shown in FIG. 12.

In a wafer prober 501, grooves 67 having a concentric circles-like shape, as viewed from the above, are formed on a surface of a disc-shaped ceramic substrate 63, and a plurality of suction holes 68 for absorbing the silicon wafer are provided at a portion of the grooves 67. A circular chuck top conductor layer 62 for connecting electrodes of the silicon wafer is provided on the most part of the ceramic substrate 63 including the grooves 67.

Meanwhile, in order to control the temperature of the silicon wafer, a resistance heating element 61 shown in FIG. 1 having a shape of concentric circles as viewed from the above are provided on a bottom face of the ceramic substrate 63. External terminals (not shown) are connected and fixed to both ends of the resistance heating element 61. Moreover, a guard electrode 65 and a ground electrode 66 having a lattice shape as viewed from the above (reference to FIG. 13) are provided inside the ceramic substrate 63 in order to remove stray capacitor and noise.

In the above electrostatic chuck, the resistance heating element 61 may be provided inside the ceramic substrate 63, and a material of the guard electrode 65 and the ground electrode 66 may be the same as that of the electrostatic electrode.

It is desirable that a thickness of the chuck top conductor layer 62 is 1 to 20 $\mu$m. When the thickness is less than 1 $\mu$m, the resistance value becomes too high, and the chuck top conductor layer 62 does not serve as an electrode. Meanwhile, when the thickness exceeds 20 $\mu$m, the chuck top conductor layer 62 is easily exfoliated due to a stress that the conductor has.

As the chuck top conductor layer 62, at least one kind of metal selected from high-melting point metal such as copper, titanium, chromium, nickel, a noble metal (gold, silver, platinum, etc.), tungsten and molybdenum, and the like can be used.

In the wafer prober having a such a structure, after a silicon wafer on which a semiconductor circuit is formed is put, a probe card having a tester pin is pushed against the silicon wafer, and while the silicon wafer is heated and cooled, a voltage is applied thereto so that a continuity test can be conducted. Moreover, since the fractured face of the ceramic substrate shows the state of intergranular fracture, the ceramic substrate has excellent thermal shock resistance. Further, by subjecting the ceramic substrate to the annealing treatment and the like the ceramic substrate has excellent thermal conductivity.

In case that the wafer prober is produced, similarly to the electrostatic chuck for example, the ceramic substrate in which resistance heating element is embedded is firstly produced, and grooves are formed on the surface of the ceramic substrate, and the surface portion where the grooves were formed is subjected to sputtering, plating and the like so that a metal layer may be formed.

BEST MODE FOR CARRYING OUT THE INVENTION

Hereinafter, the present invention will be explained in detail.

EXAMPLE 1

Production of Electrostatic Chuck (reference to FIG. 3)

(1) Paste, which was obtained by mixing 1000 parts by weight of aluminum nitride powder (made by Tokuyama Corp., average particle diameter: 0.6 $\mu$m), 40 parts by weight of yttria (average particle diameter: 0.4 $\mu$m), 115 parts by weight of acrylic binder, 0.002 parts by weight of boron nitride, 5 parts by weight of dispersant and 530 parts by weigh of alcohol comprising 1-butanol and ethanol, was used to be formed by the doctor blade method so that a green sheet having a thickness of 0.47 mm was obtained.

(2) Next, after the green sheet was dried at 80° C. for 5 hours, portions which were to become through holes having diameters of 1.8 mm, 3.0 mm and 5.0 mm into which semiconductor wafer supporting pins are inserted, and portions which were to become conductor filled through holes for connecting external terminals were provided by punching.

(3) 100 parts by weight of tungsten carbide particles having an average particle diameter of 1 $\mu$m, 3.0 parts by weight of acrylic binder, 3.5 parts by weight of α-terpineol solvent and 0.3 parts by weight of dispersant were mixed so that conductor containing paste A was prepared.

100 parts by weight of tungsten particles having an average particle diameter of 3 $\mu$m, 1.9 parts by weight of acrylic binder, 3.7 parts by weight of α-terpineol solvent and 0.2 parts by weight of dispersant were mixed so that conductor containing paste B was prepared.

The conductor containing paste A was printed on the green sheet by screen printing so that a conductor containing paste layer was formed. A printing pattern was a concentric circle-like pattern. Moreover, a conductor containing paste layer of an electrostatic electrode pattern having a shape shown in FIG. 2 was formed on another green sheet.

Further, the conductor containing paste B was filled into the through hole for the conductor filled through hole for connecting external terminals.

34 green sheets 50' on which tungsten paste is not printed were laminated on an upper side (heating face side) of the green sheet 50 which was subjected to the above process, and 13 green sheets 50' were laminated on a lower side. The green sheet 50 on which the conductor containing paste layer having the electrostatic electrode pattern was printed was laminated thereon, and two green sheets 50' on which the tungsten paste was not printed were laminated thereon. They were pressed to be attached each other at a pressure of 80 kg/cm$^2$ at 130° C. so that a lamination was formed (reference to FIG. 8(a)).

(4) Next, the obtained lamination was degreased at 600° C. for 5 hours in nitrogen gas, and was hot-pressed at 1890° C. for 3 hours under a pressure of 200 kg/cm$^2$ so that an aluminum nitride plate-shaped body having a thickness of 3 mm was obtained. The aluminum nitride plate-shaped body was cut out into a disc shape of 230 mm so that a plate-shaped body made of aluminum nitride, which includes the resistance heating element 5 having a thickness of 6 $\mu$m and a width of 10 mm, the chuck positive electrostatic layer 2 and the chuck negative electrostatic layer 3 having a thickness of 10 $\mu$m, was obtained (reference to FIG. 8(b)). Thereafter, the plate-shaped body was subjected to the annealing treatment at 1700° C. for 3 hours.

When a fractured section of this sintered body was observed by an electron microscope (at a magnification of 2000 times), intergranular fracture was observed. Moreover, the average grain diameter was 5 $\mu$m. Further, when the section was observed by EPMA (made by Shimadzu Corporation: EPM-810S), Y, B and O were found in the grain boundaries.

(5) Next, after the plate-shaped body obtained at (4) was ground by diamond grinder, a mask was placed and then bottomed holes (diameter: 1.2 mm, depth: 2.0 mm) for thermocouples were provided on the surface by a blast treatment by means of SiC and the like.

(6) Further, the portions where the conductor filled through holes were formed were hollowed out so as to be blind holes 35 and 36 (reference to FIG. 8(c)). Next, external terminals 6,18 made of kovar were connected thereto by using the gold blazing and by conducting heating and reflowing at 700° C. (reference to FIG. 8(d)).

It is desirable that the connection of the external terminals has a structure, wherein a support of tungsten supports at three points. This is because connection reliability can be secured.

(7) Next, a plurality of thermocouples for controlling temperature were embedded in the bottomed holes thus the production of the electrostatic chuck having the resistance heating element was completed.

EXAMPLE 2

Production of an Electrostatic Chuck (reference to FIG. 5)

(1) Paste, which was obtained by mixing 1000 parts by weight of aluminum nitride powder (made by Tokuyama Corp., average particle diameter: 0.6 $\mu$m), 40 parts by weight of yttria (average particle diameter: 0.4 $\mu$m), 115 parts by weight of acrylic binder, 0.002 parts by weight of boron nitride, 0.05 parts by weight of silica, 0.001 parts by weight of $Na_2O$, 5 parts by weight of dispersant and 530 parts by weigh of alcohol comprising 1-butanol and ethanol, was used to be formed by the doctor blade method so that a green sheet having a thickness of 0.47 mm was obtained.

(2) Next, after the green sheet was dried at 80° C. for 5 hours, portions which were to become through holes having diameters of 1.8 mm, 3.0 mm and 5.0 mm into which semiconductor wafer supporting pins are inserted, and portions which were to become conductor filled through holes for connecting external terminals were provided by punching.

(3) 100 parts by weight of tungsten carbide particles having an average particle diameter of 1 $\mu$m, 3.0 parts by weight of acrylic binder, 3.5 parts by weight of α-terpineol solvent and 0.3 parts by weight of dispersant were mixed so that conductor containing paste A was prepared.

100 parts by weight of tungsten particles having average particle diameter of 3 $\mu$m, 1.9 parts by weight of acrylic binder, 3.7 parts by weight of α-terpineol solvent and 0.2 parts by weight of dispersant were mixed so that a conductor containing paste B was prepared.

The conductor containing paste A was printed on the green sheet by screen printing so that a conductor containing paste layer composed of electrostatic electrode pattern shown in FIG. 10 was formed.

Further, the conductor containing paste B was filled into the through holes for the conductor filled through holes for connecting external terminals.

One green sheet on which tungsten paste is not printed was laminated on an upper side (heating face side) of the green sheet which was subjected to the above process, and 48 green sheets were laminated on a lower side. They were pressed to be attached each other at a pressure of 80 kg/cm² at 130° C. so that a lamination was formed.

(4) Next, the obtained lamination was degreased at 600° C. for 5 hours in nitrogen gas, and was hot-pressed at 1890° C. for 3 hours at a pressure of 150 kg/cm² so that an aluminum nitride plate-shaped body having a thickness of 3 mm was obtained. The aluminum nitride plate-shaped body was cut out into a disc shape of 230 mm so that a plate-shaped body made of aluminum nitride, which includes the chuck positive electrostatic layer 2 and the chuck negative electrostatic layer 3 having a thickness of 15 $\mu$m, was obtained. Thereafter, the plate-shaped body was subjected to the annealing treatment at 1700° C. for 3 hours.

When a fractured section of this sintered body was observed by an electron microscope (at a magnification of 2000 times), intergranular fracture was found. Moreover, the average grain diameter was 5 $\mu$m. Further, when the section was observed by EPMA (made by Shimadzu Corporation: EPM-810S), Y, Na, Si and O were found in the grain boundaries.

(5) A mask was placed on a bottom face of the plate-shaped body obtained in (4) and concave portions (not shown) for thermocouples were provided on the surface by a blast treatment by means of SiC and the like.

(6) Next, conductor containing paste for resistance heating element was formed on a face (bottom face) opposed to the wafer putting face. As the conductor containing paste, SOLVESTPS603D made by Tokuriki Kagaku Kenkyujo which is used for forming plated through holes of a printed circuit board was used. This conductor containing paste was silver/lead paste, and this included 7.5 parts by weight of metal oxide composed of lead oxide, zinc oxide, silica, boron oxide and alumina (their weight ratio is 5/55/10/25/5) with respect to 100 parts by weight of silver.

Further, the form of the silver was scaly and its average particle diameter was 4.5 $\mu$m.

(7) The plate-shaped body on which the conductor containing paste was printed was heated and fired at 780° C. so that silver and lead in the conductor containing paste are sintered and baked on the ceramic substrate 25. Further, the plate-shaped body was immersed into electroless nickel plating bath containing aqueous solution including 30 g/l of nickel sulfate, 30 g/l of boric acid, 30 g/l of ammonium chloride and 60 g/l of Rochelle salt so that a metal covering layer of nickel 25a having a thickness of 1 $\mu$m was deposited on the surface of the resistance heating element comprising the silver sintered body. Thereafter, the plate-shaped body was subjected to the annealing treatment at 120° C. for 3 hours.

The resistance heating element 25 comprising silver sintered body had a thickness of 5 $\mu$m, a width of 2.4 mm, and area resistivity of 7.7 m$\Omega$/□.

(8) Next, blind holes for exposing the conductor filled through holes 16 from the ceramic substrate 1 were provided. The external terminal pins made of Kovar were connected thereto by using gold blaze made of Ni—Au alloy (81.5 weight % of Au, 18.4 weight % of Ni and 0.1 weight % of impurity) and by conducting heating and reflowing at 970° C. Moreover, external terminal pins made of Kovar were formed on the resistance heating element through solder (tin 9/lead 1).

(9) Next, a plurality of thermocouples for controlling temperature were embedded in the concave portions, and thus the electrostatic chuck 201 was obtained.

(10) Next, the electrostatic chuck 201 was fitted into the supporting case 41 made of stainless having a sectional form shown in FIG. 11 through a heat insulating material 45 made of ceramic fiber (made by Ibiden Co., tradename "Ibiwool"). This supporting case 41 has the coolant outlet 42 for cooling gas, so that a temperature of the electrostatic chuck 201 can be adjusted.

The resistance heating element 25 of the electrostatic chuck 201 fitted into the supporting case 41 was energized in order to raise the temperature thereof and, at the same time, the coolant was flowed through the supporting case, so that the temperature of the electrostatic chuck 201 was controlled. The temperature control was very excellently performed.

EXAMPLE 3

Production of an Electrostatic Chuck 301 (FIG. 6)

(1) Tungsten foil having a thickness of 10 $\mu$m was punched so that two electrodes having a shape shown in FIG. 9 were formed.

The two electrodes and tungsten wires as well as a mixture comprising 1000 parts by weight of aluminum nitride powder (made by Tokuyama Corp., average particle diameter: 0.6 μm), 40 parts by weight of yttria (average particle diameter: 0.4 μm), 115 parts by weight of acrylic binder, 0.002 parts by weight of boron nitride, 0.05 parts by weight of silica and 0.001 parts by weight of calcia, were put into a mold. Thereafter, they were hot-pressed at 1890° C. for 3 hours at a pressure of 200 kg/cm² in nitrogen gas so that an aluminum nitride plate-shaped body having a thickness of 3 mm was obtained. This was cut out into a circular plate having a diameter of 230 mm so as to have a plate-shaped body. At this time, a thickness of the electrostatic electrode layer was 10 μm.

(2) This plate-shaped body is subjected to the steps (5) to (7) in the example 1 thus the electrostatic chuck 301 was obtained.

When the fractured section of this sintered body was observed by an electron microscope (at the magnification rate of 2000 times), intergranular fracture was found. Moreover, the average grain diameter was 5 μm. Further, when the section was observed by EPMA (made by Shimadzu Corporation, EPM-810S), Y, Ca, Si and O were found in the grain boundaries.

EXAMPLE 4

Production of Electrostatic Chuck 401 (FIG. 7)
After the steps (1) to (5) in the example 2 were carried out, nickel was metalized on the bottom face, and a Peltier device of lead and tellurium was joined so that the electrostatic chuck 401 was obtained.

The electrostatic chuck produced in such a manner has an excellent temperature falling property, and when it was cooled by the Peltier device, the temperature drops from 450° C. to 100° C. in 3 minutes.

COMPARATIVE EXAMPLE 1

(1) Paste, which was obtained by mixing 1000 parts by weight of aluminum nitride powder heated at 500° C. in the air (made by Tokuyama Corp, average particle diameter: 0.6 μm), 20 parts by weight of alumina (average particle diameter: 0.4 μm), 115 parts by weight of acrylic binder, 5 parts by weight of polyether sulfon, 0.03 parts by weight of silica, 5 parts by weight of dispersant, and 530 parts by weigh of alcohol comprising 1-butanol and ethanol, was used to be formed by the doctor blade method so that a green sheet having a thickness of 0.47 mm was obtained. Except for abovementioned part, the electrostatic chuck was obtained in the similar manner to the example 1.

EXAMPLE 5

Production of a Wafer Prober 201 (reference to FIGS. 12 and 13)

(1) Paste, which was obtained by mixing 1000 parts by weight of aluminum nitride powder (made by Tokuyama Corp, average particle diameter: 0.6 μm), 40 parts by weight of yttria (average particle diameter: 0.4 μm), 115 parts by weight of acrylic binder, 0.002 parts by weight of boron nitride, 5 parts by weight of dispersant, and 530 parts by weigh of alcohol comprising 1-butanol and ethanol, was used to be formed by the doctor blade method so that a green sheet having a thickness of 0.47 mm was obtained.

(2) Next, after the green sheet was dried at 80° C. for 5 hours, through holes for conductor filled through holes for connecting the heating element and external terminal pins were provided by punching.

(3) 100 parts by weight of tungsten carbide particles having average particle diameter of 1 μm, 3.0 parts by weight of acrylic binder, 3.5 parts by weight of α-terpineol solvent and 0.3 parts by weight of dispersant were mixed so that conductor containing paste A was prepared.

In addition, 100 parts by weight of tungsten particles having average particle diameter of 3 μm, 1.9 parts by weight of acrylic binder, 3.7 parts by weight of α-terpineol solvent and 0.2 parts by weight of dispersant were mixed so that conductor containing paste B was prepared.

Next, a lattice-shaped guard electrode printed body and a ground electrode printed body were printed by screen printing using the conductor containing paste A.

Further, the conductor containing paste B was filled into the through holes for conductor filled through holes for connecting external terminals.

Further, 50 green sheets with and without printed bodies were laminated and then they were integrated at a pressure of 80 kg/cm² and at a temperature of 130° C. so that a lamination was formed.

(4) Next, this lamination was degreased at 600° C. for 5 hours in nitrogen gas, and was hot-pressed at 1890° C. for 3 hours at a pressure of 200 kg/cm² so that an aluminum nitride plate-shaped body having a thickness of 3 mm was obtained. The aluminum nitride plate-shaped body was cut out into a circular shape having a diameter of 300 mm so that a plate-shaped body made of ceramic was obtained. As for the size of the conductor filled through holes 16, its diameter was 0.2 mm and its depth was 0.2 mm.

In addition, a thickness of the guard electrode 65 and the ground electrode 66 was 10 μm, and a forming position of the guard electrode 65 was 1 mm from the wafer putting face, and a forming position of the ground electrode 66 was 1.2 mm from the wafer putting face. Moreover, a size of one side of a conductor non-formed area 66a of the guard electrode 65 and the ground electrode 66 was 0.5 mm.

(5) After the plate-shaped body obtained at (4) was ground by a diamond grinder, a mask was placed thereon, and concave portions for thermocouples and grooves 76 for absorbing wafer (width: 0.5 mm, depth: 0.5 mm) were provided on the surface by the blast treatment by means of SiC and the like.

(6) Further, a layer for forming the heating element 61 was printed on a face opposed to the wafer putting face. Conductor containing paste was used for the printing. As the conductor containing paste, Solvest PS603D made by Tokuriki Kagaku Kenkyujo which is used for forming a plated through hole of a printed circuit board was used. This conductor containing paste was silver/lead paste, and this included 7.5 parts by weight of metal oxide comprising lead oxide, zinc oxide, silica, boron oxide and alumina (their weight ratio is 5/55/10/25/5) with respect to 100 parts by weight of silver.

Further, the form of the silver was scaly and its average particle diameter was 4.5 μm.

(7) The ceramic substrate on which the conductor containing paste was printed was heated and fired at 780° C. so that silver and lead in the conductor containing paste are sintered and baked on the ceramic substrate 43. Further, a heater plate was immersed into an electroless nickel plating bath comprising a solution containing 30 g/l of nickel sulfate, 30 g/l of boric acid, 30 g/l of ammonium chloride and 60 g/l of Rochelle salt, and a nickel layer (not shown), which has a thickness of 1 μm and includes 1 weight % or less of boron, was deposited on the surfaces of the resistance heating element 61 comprising silver sintered body. Thereafter, the ceramic substrate was subjected to the annealing treatment at 120° C. for 3 hours.

When the fractured section of this sintered body was observed by an electron microscope (at a magnification of 2000 times), intergranular fracture was found. Moreover, the average grain diameter was 5 μm. Further, when the section was observed by EPMA (made by Shimadzu Corporation, EPM-810S) Y, B and O were found in the grain boundaries.

The heating element comprising silver sintered body had a thickness of 5 μm, a width of 2.4 mm, and area resistivity of 7.7 mΩ/□.

(8) A titanium layer, a molybdenum layer and a nickel layer were successively formed on the surface on which the grooves 67 were formed by the sputtering method. As a device for the sputtering, SV-4540 made by ULVAC Japan Ltd. was used. As for sputtering conditions, air pressure was 0.6 Pa, a temperature was 100° C., and an electric power was 200 W. Sputtering time was in a range of 30 seconds to 1 minutes, and adjusted according to respective metals.

As for thickness of the films, according to an image of a fluorescence X-ray analyzer, the titanium layer was 0.3 μm, the molybdenum layer was 2 μm and the nickel layer was 1 μm.

(9) The ceramic substrate obtained at (8) was immersed into electroless nickel plating bath comprising aqueous solution containing 30 g/l of nickel sulfate, 30 g/l of boric acid, 30 g/l of ammonium chloride and 60 g/l Rochelle salt. The nickel layer, which has a thickness of 7 μm and includes 1 weight % or less of boron, was deposited on the surface of the metal layer formed by sputtering and was annealed at 120° C. for 3 hours.

An electric current did not flow on the surface of the heating element and was not covered with electro nickel plating.

Further, the ceramic substrate was immersed in an electroless gold plating bath containing 2 g/l of gold cyanide potassium, 75 g/l of ammonium chloride, 50 g/l of sodium citrate and 10 g/l of sodium hypophosphate on its surface at 93° C. for 1 minutes so that a gold plating layer having a thickness of 1 μm was formed on the nickel plating layer.

(10) An air suction hole 68 penetrating the ceramic plate to the back face from the grooves 67 were formed by drilling, and further, blind holes (not shown) for exposing the conductor filled through holes 16 were provided. An external terminal made of kovar was connected to the blind hole by using gold brazing of Ni—Au alloy (Au: 81.5 weight %, Ni: 18.4 weight % and impurities: 0.1 weight %) and conducting heating and reflowing at 970° C. Moreover, external terminal pins made of Kovar were formed on the heating element through solder (tin 90 weight %/lead 10 weight %).

(11) Next, a plurality of thermocouples for controlling temperature were embedded in the concave portions, and thus the wafer prober heater 201 was obtained.

EXAMPLES 6 TO 11

The present examples are similar to the example 1, but by changing the firing temperature and thus changing the average diameter of the ceramic grains on the fractured section, the relation among the fracture toughness value, the bending strength and the thermal conductivity were inspected. Here, in the example 6, the material particles having average particle diameter of 0.2 μm were used.

EXAMPLE 12

Paste, which was obtained by mixing 100 parts by weight of silicon nitride powder (made by Tokuyama Corp., average particle diameter: 0.6 μm), 40parts by weight of yttria (average particle diameter: 0.4 μm), 20 parts by weight of alumina, 40 parts by weight of silica, 11.5 parts by weight of acrylic binder, 0.5 parts by weight of dispersant and 53 parts by weight of alcohol comprising 1-butanol and ethanol, was used and was formed by the doctor blade method thus a green sheet having a thickness of 0.50 mm was obtained.

Thereafter, the firing temperature was set at 1900° C. Except these abovementioned parts, an electrostatic chuck was produced similarly to the example 1.

EXAMPLE 13

The present example is similar to the example 1, but firing was carried out at 1650° C. When the fractured section was observed by an electron microscope (at a magnification of 2000 times), the grain diameter was 12 μm, that is, large. It is considered that the grain diameter becomes larger as the firing temperature rises up to about 1700° C. On the contrary, it is considered that when the firing temperature exceeds 1700° C., as the temperature becomes higher, the grain diameter becomes larger.

In addition, even though annealing is carried out, it is not considered that impurities are discharged sufficiently, and the thermal conductivity is low.

EXAMPLE 14

The present example was similar to the example 1, but green sheets which did not contain yttria were produced beforehand, and these green sheets were arranged on both sides of the lamination and the hot-pressing was carried out.

In the sintered body obtained in the present example, an impurity-existent area (reference to FIG. 17) where an impurity element (Y, O) is locally distributed in the triple points of the crystal grains and an impurity element-nonexistent area (reference to FIG. 18) where impurities do not exist in the triple points of the crystal grains coexisted. Moreover, a voltage of 5 kV was applied to the sintered body in direction of its thickness at temperatures of 100° C., 200° C., 300° C., 400° C. and 500° C., and existence/non-existence of dielectric breakdown was checked. At all the temperatures, the dielectric breakdown was not observed. Incidentally, when the sintered body produced in the example 1 was similarly checked for existence/non-existence of the dielectric breakdown, dielectric breakdown was observed at 500° C.

EXAMPLE 15

The present example is similar to the example 2, but green sheets which did not include yttria was produced beforehand, and these green sheets were arranged on both sides of the lamination and the hot-pressing was carried out. In the sintered body obtained in the present example, an impurity-existent area and an impurity element-nonexistent area coexisted. Moreover, when existence/non-existence of dielectric breakdown was observed by the same method as the example 14, dielectric breakdown was not observed in the sintered body obtained in the present example.

EXAMPLE 16

The present example is similar to the example 3, but green sheets which did not include yttria was produced beforehand, and when an electrode and a mixture were put into a mold, these green sheets were arranged on both sides of the mixture and hot-pressing was carried out. In the sintered body obtained in the present example, an impurity-existent area and an impurity element-nonexistent area coexisted. Moreover, when existence/non-existence of dielectric breakdown was observed by the same method as the example 14, dielectric breakdown was not observed in the sintered body obtained in the present example.

EXAMPLE 17

The present example is similar to the example 4, but green sheets which did not include yttria were produced beforehand, and the green sheets were arranged on both sides of the lamination and hot-pressing was carried out. In the sintered body obtained in the present example, an impurity-existent area and an impurity element-nonexistent area coexisted. Moreover, when existence/non-existence of dielectric breakdown was observed by the same method as the example 14, dielectric breakdown was not observed in the sintered body obtained in the present example Evaluation Method (1) Measurement of the Fracture Toughness Value The fracture toughness value was obtained by using a Vickers hardness measuring device ("MVK-D" type manufactured by Akashi Seisakusho Co.), by pressing the indentator into the surface of the sample, measuring the length of the generated crack and performing the calculation according to the calculation formula (1) described below.

$$\text{Fracture toughness value} = 0.026 \times E^{1/2} \times 0.5 \times p^{1/2} \times a \times C^{-3/2} \quad (1)$$

where E represents the Young's modulus ($3.18 \times 10^{11}$ Pa) P represents the pressing load (98N), "a" represents a half of the average length of the indentation diagonal line (m), C represents a half of the average length of cracks (m).

The fracture toughness values of the ceramic substrates obtained in the examples and the comparative example are listed in following tables 1 to 3.

(2) Observation of Fractured Section

Figure 14:
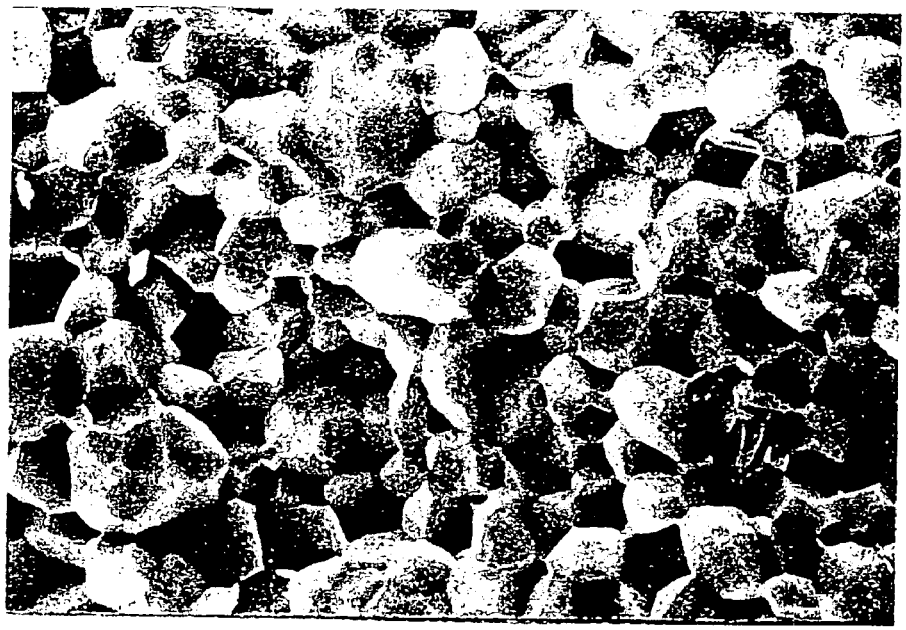
FIG. 14 is a SEM photogragh showing a fractured section of the ceramic substrate constituting the electrostatic chuck according to an example 1.
Figure 15:
FIG. 15 is a SEM photogragh showing a fractured section of the ceramic substrate constituting the electrostatic chuck according to a comparative example 1.

The fractured sections were observed with an electron microscope at a magnification of 2000 times and whether the fractured section exhibited the state of intragranular fracture or not, was checked. FIGS. 14 and 15 are scanning electron microscopic (SEM) photograghs of the fractured section of fracture of the ceramic substrate obtained in the example 1 and the comparative example 1.

(3) Measurement of the Thermal Conductivity a. Devices Used for the Measurement

Thermal constant measuring device according to the Rigaku laser flush method
LF/TCM-FA8510B b. Test Conditions

| Temperature: | Room temperature |
|---|---|
| Atmosphere: | vacuum | c. Measurement Method

The temperature detection during the measurement of specific heat was carried out by using a thermocouple attached to the back surface of the sample with silver paste (a platinel).

The measurement of specific heat at the room temperature was carried out in a state in which a light-receiving plate (glassy carbon) was further attached to the upper surface of the sample through silicon grease. The specific heat (Cp) of each sample was obtained according to the calculation formula described below.

$$Cp = \left\{ \frac{\Delta O}{\Delta T} - Cp_{G,C} \cdot W_{G,C} - Cp_{S,G} \cdot W_{S,G} \right\} \frac{1}{W} \quad (2)$$

In the abovementioned calculation formula (2), $\Delta O$ represents the input energy, $\Delta T$ represents the saturation value of the temperature rise of the sample, $Cp_{G,C}$ represents the specific heat of the glassy carbon, $W_{G\ C}$ represents the weight of the glassy carbon, $Cp_{S,G}$ represents the specific heat of the silicon grease, $W_{S,G}$ represents the weight of the silicon grease, W represents the weight of the sample.

(4) Bending Strength

The bending strength was measured by using an Instron type universal tester (4507 type, load cell: 500 kgf) in the air at 25° C., at cross head speed of 0.5 mm/min., at span distance L of 30 mm, with a thickness of test piece of 3.06 mm, with a width of the test piece of 4.03 mm. Three-point bending strength a (kgf/mm$^2$) was calculated according to the following calculating equation (3).

$$\sigma = \frac{3PL}{2\ wt^2} \quad (3)$$

TABLE 1

| | Fracture toughness value (MPa · m$^{1/2}$) | Thermal conductivity (W/mK) | Fractured section |
|---|---|---|---|
| Example 1 | 3.1 | 180 | intergranular fracture |
| Example 2 | 4.0 | 190 | intergranular fracture |
| Example 3 | 3.5 | 185 | intergranular fracture |
| Example 4 | 3.0 | 180 | intergranular fracture |
| Example 5 | 3.1 | ~180 | intergranular fracture |
| Comparative Example 1 | 2.5 | 85 | intragranular fracture |

TABLE 2

| | Firing temperature (° C.) | Grain diameter of fractured section (∞m) | Bending strength (MPa) | Fracture toughness value (Mpa · m$^{1/2}$) | Thermal conductivity (W/mK) | Fractured section |
|---|---|---|---|---|---|---|
| Example 6 | 1710 | 0.5 | 400 | 3.0 | 170 | intergranular fracture |

TABLE 2-continued

|  | Firing temperature (° C.) | Grain diameter of fractured section (μm) | Bending strength (MPa) | Fracture toughness value (Mpa · m$^{1/2}$) | Thermal conductivity (W/mK) | Fractured section |
|---|---|---|---|---|---|---|
| Example 7 | 1750 | 1 | 450 | 3.0 | 175 | intergranular fracture |
| Example 8 | 1800 | 3 | 500 | 3.5 | 185 | intergranular fracture |
| Example 9 | 1890 | 5 | 500 | 4.0 | 190 | intergranular fracture |
| Example 10 | 1900 | 10 | 300 | 2.8 | 185 | intergranular fracture |
| Example 11 | 1950 | 15 | 280 | 2.5 | 180 | intergranular fracture |
| Example 12 | 1900 | 8 | 700 | 7.0 | 40 | intergranular fracture |
| Example 13 | 1650 | 12 | 285 | 2.6 | 170 | intergranular fracture |

TABLE 3

|  | Fracture toughness value (Mpa · m$^{1/2}$) | Thermal conductivity (W/mK) | Fractured section |
|---|---|---|---|
| Example 14 | 4.3 | 200 | intergranular fracture |
| Example 15 | 4.5 | 200 | intergranular fracture |
| Example 16 | 4.4 | 200 | intergranular fracture |
| Example 17 | 4.4 | 200 | intergranular fracture |

As is clear from the tables 1 to 3, regarding the electrostatic chucks and wafer probers with a hot plate according to the examples 1 to 17, the thermal conductivity is high, and the fractured face shows the state of intergranular fracture, thus the fracture toughness value is high. Meanwhile, in the electrostatic chuck with a hot plate according to the comparative example 1, the fracture toughness value is low and the thermal shock resistance is inferior. Also, it has low thermal conductivity.

INDUSTRIAL APPLICABILITY

As explained above, in the ceramic substrate for a semiconductor producing/examining device of the present invention, thermal shock resistance is excellent and thermal conductivity is high since high fracture toughness value can be secured. Therefore, the ceramic substrate for a semiconductor producing/examining device which is suitable for a hot plate, an electrostatic chuck, a wafer prober and the like can be provided.

What is claimed is:

1. A ceramic substrate having a conductor inside thereof, wherein the ceramic substrate is a sintered aluminum nitride substrate having a disc shape and a fractured section with intergranular fracture, and
at least one rare earth element is locally distributed in triple points of crystal grains.

2. The ceramic substrate according to claim 1, wherein an average diameter of ceramic grains of said fractured section is 0.5 to 10 μm.

3. The ceramic substrate according to claim 1, wherein the thermal conductivity of said ceramic substrate is 100 W/m·K or more.

4. The ceramic substrate according to claim 1, wherein said ceramic substrate has a diameter of 200 mm or more.

5. The ceramic substrate according to claim 1, wherein said ceramic substrate has a diameter of 300 mm or more.

6. The ceramic substrate according to claim 1, wherein said ceramic substrate has a thickness of 25 mm or less.

7. A semiconductor producing/examining device comprising the ceramic substrate according to claim 1.

8. A ceramic substrate comprising a conductor on a surface thereof,
wherein the ceramic substrate is a sintered aluminum nitride substrate having a disc shape and a fractured section with intergranular fracture, and
at least one rare earth element is locally distributed in triple points of crystal grains.

9. The ceramic substrate according to claim 8, wherein an average diameter of ceramic grains of said fractured section is 0.5 to 10 μm.

10. The ceramic substrate according to claim 8, wherein the thermal conductivity of said ceramic substrate is 100 W/m·K or more.

11. The ceramic substrate according to claim 8, wherein said ceramic substrate has a diameter of 200 mm or more.

12. The ceramic substrate according to claim 8, wherein said ceramic substrate has a diameter of 300 mm or more.

13. The ceramic substrate according to claim 8, wherein said ceramic substrate has a thickness of 25 mm or less.

14. A semiconductor producing/examining device comprising the ceramic substrate according to claim 8.

15. The ceramic substrate according to claim 1, wherein at least one member selected from the group consisting of B, Na, Ca, Si and O is locally distributed in said triple points of crystal grains.

16. The ceramic substrate according to claim 1, wherein Y and O are locally distributed in said triple points of crystal grains.

17. The ceramic substrate according to claim 1, wherein Y, O and Si are locally distributed in said triple points of crystal grains.

18. The ceramic substrate according to claim 1, wherein said conductor is a resistance heating element.

19. The ceramic substrate according to claim 1, wherein said ceramic substrate is configured to be used at a temperature of 200° C. or higher.

20. The ceramic substrate according to claim 8, wherein at least one member selected from the group consisting of B, Na, Ca, Si and O is locally distributed in said triple points of crystal grains.

21. The ceramic substrate according to claim 8, wherein Y and O are locally distributed in said triple points of crystal grains.

22. The ceramic substrate according to claim 8, wherein Y, O and Si are locally distributed in said triple points of crystal grains.

23. The ceramic substrate according to claim 8, wherein said conductor is a resistance heating element.

24. The ceramic substrate according to claim 8, wherein said ceramic substrate is configured to be used at a temperature of 200° C. or higher.

25. The ceramic substrate according to claim 1,
wherein the thermal conductivity of said ceramic substrate is 170 W/m·K or more.

26. The ceramic substrate according to claim 8,
wherein the thermal conductivity of said ceramic substrate is 170 W/m·K or more.

* * * * *